(12) United States Patent
Hwang et al.

(10) Patent No.: US 8,446,776 B2
(45) Date of Patent: May 21, 2013

(54) METHOD OF PROGRAMMING MEMORY CELLS FOR A NON-VOLATILE MEMORY DEVICE

(75) Inventors: Sang-Won Hwang, Suwon-si (KR); Chan-Ho Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 13/022,688

(22) Filed: Feb. 8, 2011

(65) Prior Publication Data

US 2011/0194353 A1  Aug. 11, 2011

(30) Foreign Application Priority Data

Feb. 8, 2010  (KR) .................. 10-2010-0011624

(51) Int. Cl.
*G11C 11/34*  (2006.01)
(52) U.S. Cl.
USPC ............ 365/185.19; 365/185.18; 365/185.22; 365/185.24
(58) Field of Classification Search
USPC .............. 365/185.19, 185.18, 185.22, 185.24
See application file for complete search history.

(56) References Cited

U.S. PATENT DOCUMENTS

| | | | |
|---|---|---|---|
| 7,259,976 B2 * | 8/2007 | Lee et al. .......................... 365/3 |
| 7,310,271 B2 * | 12/2007 | Lee ......................... 365/185.22 |
| 7,349,263 B2 * | 3/2008 | Kim et al. ................ 365/185.19 |
| 7,397,704 B2 * | 7/2008 | Sim .......................... 365/185.22 |
| 7,463,526 B2 * | 12/2008 | Kang et al. ............... 365/185.22 |
| 7,468,907 B2 * | 12/2008 | Kang et al. ............... 365/185.03 |
| 7,652,925 B2 * | 1/2010 | Sim .......................... 365/185.19 |
| 7,692,970 B2 * | 4/2010 | Park et al. ................ 365/185.22 |
| 7,764,542 B2 | 7/2010 | Edahiro et al. |
| 7,796,438 B2 * | 9/2010 | Kim et al. ................ 365/185.22 |
| 7,826,273 B2 * | 11/2010 | Baik ........................ 365/185.22 |
| 7,965,553 B2 * | 6/2011 | Han ......................... 365/185.09 |
| 8,000,150 B2 * | 8/2011 | Seol et al. ................ 365/185.22 |
| 8,085,587 B2 * | 12/2011 | Lim ......................... 365/185.03 |
| 8,199,581 B2 * | 6/2012 | Kim ......................... 365/185.18 |
| 8,238,164 B2 * | 8/2012 | Kim et al. ................ 365/185.22 |
| 2008/0144370 A1 * | 6/2008 | Park et al. ................ 365/185.03 |
| 2009/0016104 A1 | 1/2009 | Kim |

FOREIGN PATENT DOCUMENTS

| | | |
|---|---|---|
| JP | 2008257781 | 10/2008 |
| KR | 1020070000525 A | 1/2007 |
| KR | 1020090005550 A | 1/2009 |

* cited by examiner

*Primary Examiner* — Viet Q Nguyen
(74) *Attorney, Agent, or Firm* — Volentine & Whitt, PLLC

(57) ABSTRACT

A method of programming memory cells for a non-volatile memory device is provided. The method includes performing an incremental step pulse program (ISPP) operation based on a program voltage, a first verification voltage, and a second verification voltage, and changing an increment value of the program voltage based on a first pass-fail result of the memory cells, the first pass-fail result being generated based on the first verification voltage. The ISPP operation is finished based on a second pass-fail result of the memory cells, the second pass-fail result being generated based on the second verification voltage.

18 Claims, 15 Drawing Sheets

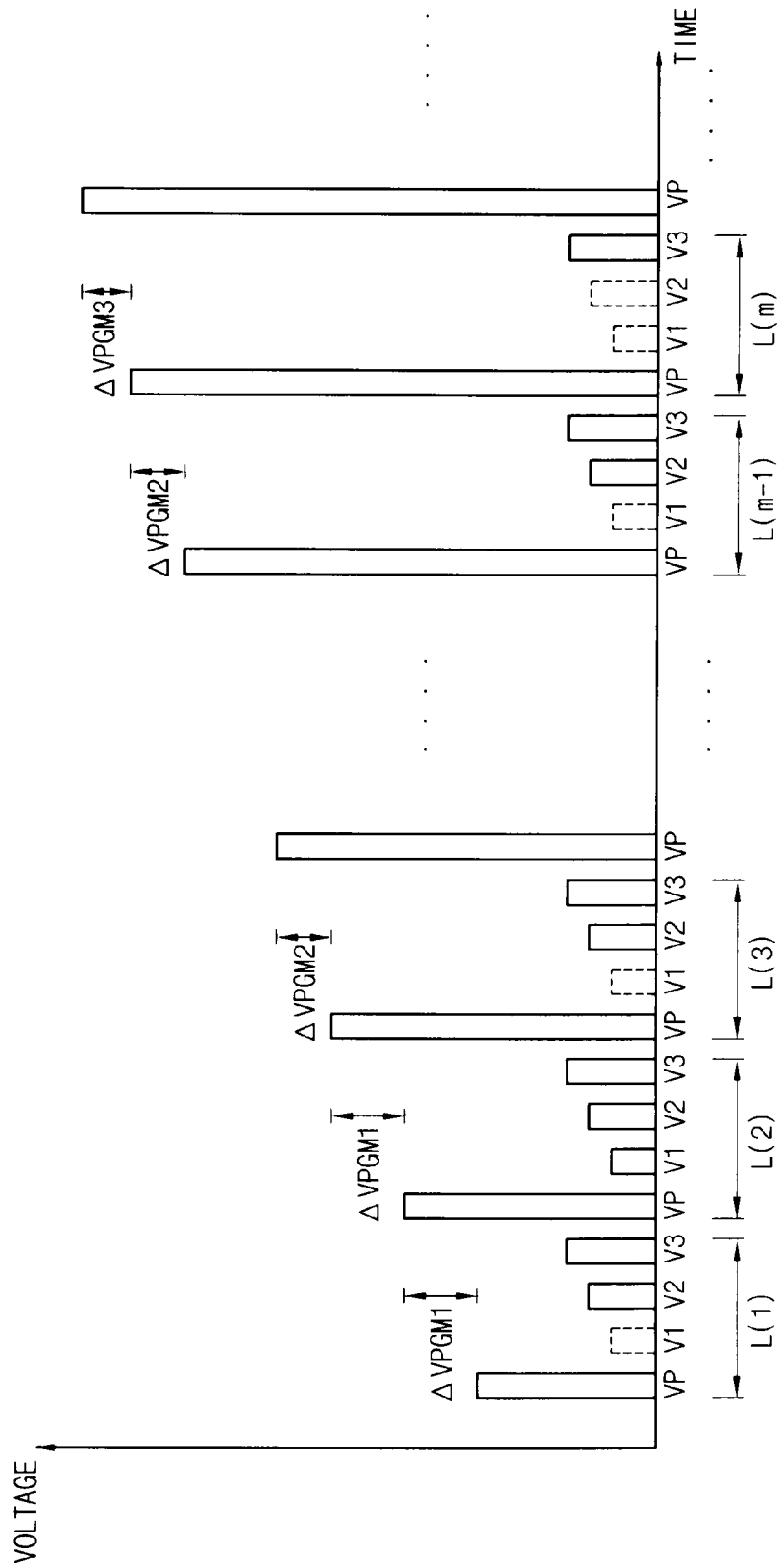

METHOD OF PROGRAMMING MEMORY CELLS FOR A NON-VOLATILE MEMORY DEVICE

CROSS-REFERENCE TO RELATED APPLICATIONS

A claim of priority under 35 U.S.C. §119 is made to Korean Patent Application No. 10-2010-0011624, filed on Feb. 8, 2010, the entire contents of which are hereby incorporated by reference.

BACKGROUND

Illustrative embodiments relate to semiconductor memory devices, and more particularly to methods of programming memory cells for a non-volatile memory device.

Semiconductor memory devices may be classified into two types: volatile memory devices and non-volatile memory devices. Flash memory devices (e.g., a NAND flash memory device) are widely used as non-volatile memory devices. Typically, a memory cell of a flash memory device may be programmed by a tunneling effect, and the flash memory device may employ an incremental step pulse program (ISPP) technique to narrow a threshold voltage (Vth) distribution of memory cells.

In conventional ISPP techniques, a program voltage continuously increases by a fixed step every program loop. Thus, flash memory devices employing conventional ISPP techniques consumes unnecessary power when the fixed step is relatively large (e.g., the program voltage may increase excessively). On the other hand, flash memory devices employing conventional ISPP techniques have low performance when the fixed step is relatively small (e.g., the number of program loops may be excessive).

SUMMARY

Illustrative embodiments provide methods of programming memory cells for a non-volatile memory device (e.g., a flash memory device), capable of adaptively changing (e.g., decreasing) an increment value of a program voltage by reflecting program states of the memory cells when the non-volatile memory device performs an incremental step pulse program (ISPP) operation.

According to various embodiments, a method of programming memory cells for a non-volatile memory device is provided. The method includes performing an ISPP operation based on a program voltage, a first verification voltage, and a second verification voltage, and changing an increment value of the program voltage based on a first pass-fail result of the memory cells, the first pass-fail result being generated based on the first verification voltage. The ISPP operation is finished based on a second pass-fail result of the memory cells, the second pass-fail result being generated based on the second verification voltage.

The first verification voltage may be smaller than the second verification voltage, and the second verification voltage may correspond to a target threshold voltage.

Performing the ISPP operation may include increasing threshold voltages of the memory cells by applying the program voltage to the memory cells, generating the first pass-fail result by comparing the threshold voltages of the memory cells with the first verification voltage, and generating the second pass-fail result by comparing the threshold voltages of the memory cells with the second verification voltage.

Generating the first pass-fail result may begin after a predetermined number of program loops are performed. Generating the first pass-fail result may end after the increment value of the program voltage is changed.

Generating the first pass-fail result may include determining the memory cells to be first fail memory cells when the threshold voltages of the memory cells are smaller than the first verification voltage, and determining the memory cells to be first pass memory cells when the threshold voltages of the memory cells are greater than the first verification voltage.

Changing the increment value of the program voltage may include maintaining the increment value of the program voltage when at least one of the memory cells is determined to be a first fail memory cell, and decreasing the increment value of the program voltage when all the memory cells are determined to be first pass memory cells.

Generating the second pass-fail result may include determining the memory cells to be second fail memory cells when the threshold voltages of the memory cells are smaller than the second verification voltage, and determining the memory cells to be second pass memory cells when the threshold voltages of the memory cells are greater than the second verification voltage.

Finishing the ISPP operation may include maintaining the ISPP operation when at least one of the memory cells is determined to be a second fail memory cell, and finishing the ISPP operation when all the memory cells are determined to be second pass memory cells.

The non-volatile memory device may be one of a NAND flash memory device or a NOR flash memory device. Also, the memory cells may be single level memory cells (SLCs) or multi-level memory cells (MLCs).

Further according to various embodiments, a method is provided for programming memory cells for a non-volatile memory device. The method includes performing an ISPP operation based on a program voltage and first through (n)th verification voltages, where n is a positive integer greater than 1; changing an increment value of the program voltage based on first through (n−1)th pass-fail results of the memory cells, the first through (n−1)th pass-fail results being generated based on the first through (n−1)th verification voltage, respectively; and finishing the ISPP operation based on a (n)th pass-fail result of the memory cells, the (n)th pass-fail result being generated based on the (n)th verification voltage.

The increment value of the program voltage may include first through (n−1)th increment values. The first through (n−1)th increment values may be smaller as n increases. Also, the first through (n)th verification voltage may be greater as n increases. The (n)th verification voltage may correspond to a target threshold voltage.

Performing the ISPP operation may include increasing threshold voltages of the memory cells by applying the program voltage to the memory cells, and generating the first through (n)th pass-fail results by comparing the threshold voltages of the memory cells with the first through (n)th verification voltage, respectively.

Generating the first through (n)th pass-fail results includes determining the memory cells to be first through (n)th fail memory cells when the threshold voltages of the memory cells are smaller than the first through (n)th verification voltage, respectively; and determining the memory cells to be first through (n)th pass memory cells when the threshold voltages of the memory cells are greater than the first through (n)th verification voltage, respectively.

Changing the increment value of the program voltage may include sequentially selecting the first through (n−1)th increment values as the increment value of the program voltage based on the first through (n−1)th pass-fail results of the memory cells.

Finishing the ISPP operation may include maintaining the ISPP operation when at least one of the memory cells is determined to be a (n)th fail memory cell, and finishing the ISPP operation when all the memory cells are determined to be (n)th pass memory cells.

Accordingly, a method of programming memory cells for a non-volatile memory device (e.g., a flash memory device) may adaptively change (e.g., decrease) an increment value of a program voltage by reflecting program states of the memory cells when the non-volatile memory device performs an ISPP operation. As a result, the non-volatile memory device may have a dense threshold voltage (Vth) distribution of the memory cells, may prevent unnecessary power consumption due to excessive increases of a program voltage, and may provide high performance by decreasing the number of program loops performed in the ISPP operation. In addition, the method may compensate for errors due to common source line noise by verifying program states of the memory cells using multiple verification voltages.

BRIEF DESCRIPTION OF THE DRAWINGS

The embodiments of the inventive concept will be described with reference to the attached drawings.

FIG. 9 is a diagram illustrating an example in which a program voltage is applied to memory cells by a method of FIG. 6, according to an illustrative embodiment.

DETAILED DESCRIPTION

Figure 1:
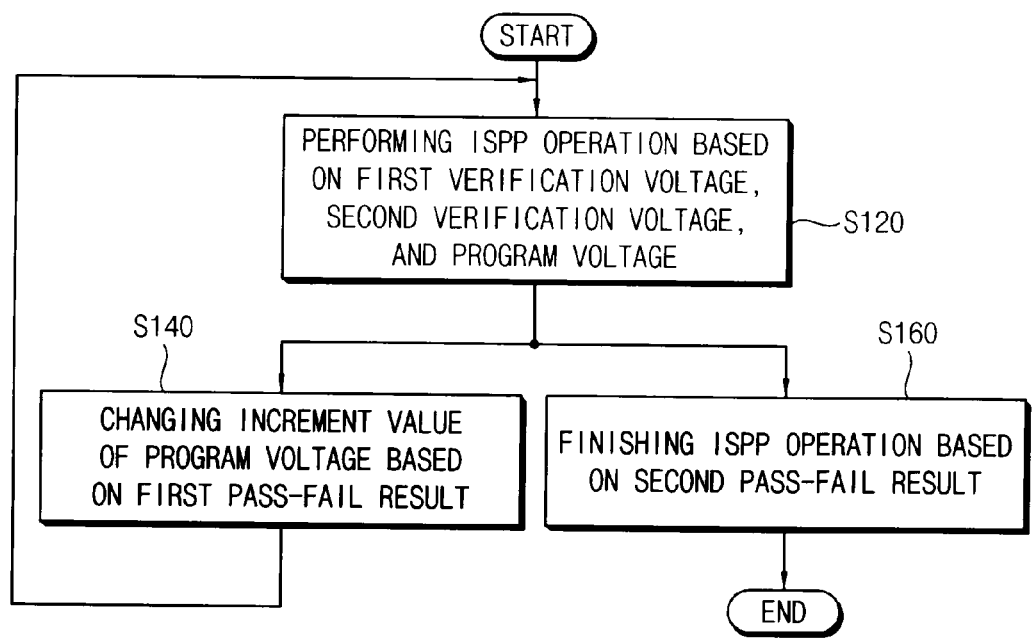
FIG. 1 is a flow chart illustrating a method of programming memory cells for a non-volatile memory device, according to illustrative embodiments.

The inventive concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. In the drawings, the thicknesses of layers and regions are exaggerated for clarity. Unless otherwise noted, like reference numerals denote like elements throughout the attached drawings and written description, and thus descriptions will not be repeated.

It will be understood that, although the terms first, second, third, etc., may be used to describe various elements, these elements are not be limited by these terms. Rather, these terms are used to distinguish one element from another. Thus, a first element could be termed a second element without departing from the teachings of the present inventive concept. Also, as used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only, and is not intended to be limiting of the present inventive concept. The singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not necessarily preclude the presence or addition of one or more other features, integers, steps, operations, elements, components, and/or groups thereof.

Unless otherwise defined, all terms (including technical and scientific terms) have the same meaning as commonly understood by one of ordinary skill in the art to which the inventive concept belongs. It will be further understood that terms should be interpreted as having meanings consistent with their meanings in the context of the relevant art, and should not be interpreted in an idealized or overly formal sense unless expressly so defined herein.

FIG. 1 is a flow chart illustrating a method of programming memory cells of a non-volatile memory device, according to illustrative embodiments.

Referring to FIG. 1, an incremental step pulse program (ISPP) operation is performed for memory cells based on a program voltage, a first verification voltage, and a second verification voltage (Step S120). An increment value of the program voltage is changed based on a first pass-fail result (Step S140). The first pass-fail result may be generated by comparing threshold voltages of the memory cells with the first verification voltage. The ISPP operation is finished based on a second pass-fail result (Step S160). The second pass-fail result may be generated by comparing threshold voltages of the memory cells with the second verification voltage.

Typically, in a non-volatile memory device (e.g., a flash memory device), multiple memory cells may be programmed by applying a ground voltage to bit-lines coupled to selected memory cells, by applying a program prohibition voltage (e.g., a power voltage) to bit-lines coupled to non-selected memory cells, and by applying a power voltage for turning on string selection transistors to a string selection line. In addition, a program voltage may be applied to word-lines coupled to the selected memory cells, and a pass voltage may be applied to word-lines coupled to the non-selected memory cells. Channels of the non-selected memory cells may be boosted by a voltage that is generated by dropping the power voltage by threshold voltages of the string selection transistors. Thus, the string selection transistors coupled to the non-selected memory cells are substantially shut off, so that the non-selected memory cells are not programmed. On the other hand, the selected memory cells are programmed, for example, by a Fowler Nordheim (F-N) tunneling effect. The F-N tunneling effect occurs between floating gates and channels in the selected memory cells because the non-selected memory cells are boosted.

In memory cells, the threshold voltage depends, in part, on channel width, channel length, and oxide thickness. In addition, although the memory cells are formed in one memory cell array, each of the memory cells may have a different threshold voltage transition speed due to manufacturing process error of the memory cells, differences in aging (e.g., degradation differences) of the memory cells, etc. The memory cells having relatively fast threshold voltage transition speeds may be referred to as fast memory cells, and the memory cells having relatively slow threshold voltage transition speeds may be referred to as slow memory cells. Both the fast memory cells and the slow memory cells may exist in one memory cell array. As a result, when the ISPP operation is performed by applying the program voltage to the fast memory cells and the slow memory cells several times, the ISPP operation may end before some of the slow memory cells are completely programmed (e.g., threshold voltages of some of the slow memory cells are smaller than the target threshold voltage). That is, when the program voltage is applied based on the fast memory cells, some slow memory cells may be incompletely programmed. On the other hand, when the program voltage is applied based on the slow memory cells, a threshold voltage distribution may be wider because threshold voltages of some fast memory cells are much greater than the target threshold voltage.

Accordingly, the ISPP operation depicted in FIG. 1 is based on the program voltage, the first verification voltage, and the second verification voltage. When multiple program loops are performed, program states of the memory cells are checked based on the first verification voltage and the second verification voltage. According to the method of FIG. 1, the increment value of the program voltage sequentially changes (e.g., decreases) based on the first pass-fail result and the second pass-fail result. The first pass-fail result is generated by checking program states of the memory cells based on the first verification voltage. The second pass-fail result is generated by checking program states of the memory cells based on the second verification voltage.

The method of FIG. 1 will be now described in more detail. For convenience of explanation, the memory cells are assumed to be single level memory cells (SLCs) that store one bit data. However, it is understood that the method of FIG. 1 likewise may be applied to multi-level memory cells (MLCs) that store multi-bit data.

According to the method of FIG. 1, the ISPP operation is performed for the memory cells based on the program voltage, the first verification voltage, and the second verification voltage (Step S120). In an embodiment, the memory cells may be programmed by the F-N tunneling effect in each of multiple program loops. The F-N tunneling effect may be caused to occur for a predetermined time by applying the ground voltage to bit-lines coupled to the selected memory cells, by applying the program prohibition voltage to bit-lines coupled to the non-selected memory cells, by applying the power voltage to the string selection line, by applying the program voltage to word-lines coupled to the selected memory cells, and by applying the pass voltage to word-lines coupled to the non-selected memory cells. Then, it is verified whether threshold voltages of the memory cells are greater than the target threshold voltage based on the first pass-fail result and the second pass-fail result.

As described above, the first pass-fail result is generated by comparing threshold voltages of the memory cells with the first verification voltage, and the second pass-fail result is generated by comparing threshold voltages with the second verification voltage. When program states of the memory cells are checked based on the first verification voltage, the memory cells having threshold voltages smaller than the first verification voltage are determined to be first fail memory cells, and the memory cells having threshold voltages greater than the first verification voltage are determined to be first pass memory cells. Thus, the first pass-fail result includes information about first fail memory cells and first pass memory cells. Likewise, when program states of the memory cells are checked based on the second verification voltage, memory cells having threshold voltages smaller than the second verification voltage are determined to be second fail memory cells, and memory cells having threshold voltages greater than the second verification voltage are determined to be second pass memory cells. Thus, the second pass-fail result includes information about the second fail memory cells and the second pass memory cells. According to various embodiments, the first verification voltage is less than the second verification voltage, and the second verification voltage corresponds to the target threshold voltage, for example.

As described above, the method of FIG. 1 checks program states of the memory cells based on multiple verification voltages (e.g., the first verification voltage and the second verification voltage). Thus, the method of FIG. 1 determines an adequate period during which changing (e.g., decreasing) the increment value of the program voltage is available, and changes (e.g., decreases) the increment of the program voltage during the adequate period to prevent unnecessary power consumption due to excessive increases of the program voltage.

The first pass-fail result is generated by performing a first verify read operation for reading threshold voltages of the memory cells, and by performing a first status check operation for comparing threshold voltages of the memory cells with the first verification voltage. Similarly, the second pass-fail result is generated by performing a second verify read operation for reading threshold voltages of the memory cells, and by performing a second status check operation for comparing threshold voltages of the memory cells with the second verification voltage. In an embodiment, the method of FIG. 1 may generate the second pass-fail result by performing the second verify read operation and the second status check operation after generating the first pass-fail result by performing the first verify read operation and the first status check operation. In another embodiment, the method of FIG. 1 may generate the first pass-fail result and the second pass-fail result by performing the first verify read operation and the second verify read operation, and then by performing the first status check operation and the second status check operation.

For example, the first status check operation and the second status check operation may be performed using a column scan pass/fail check method, or a wired-OR pass/fail check method. In the column scan pass/fail check method, a verify read operation (e.g., the first verify read operation and the second verify read operation) may be performed after multiple memory cells are programmed every program loop. Here, program states of the memory cells may be temporarily stored in registers. Then, a status check operation (e.g., the first status check operation and the second status check operation) may be performed by comparing the temporarily stored program states with a verification voltage (e.g., the first verification voltage and the second verification voltage) after the temporarily stored program states are loaded into an internal data bus.

In an embodiment, the first pass-fail result may be generated after at least one program loop is performed in an early phase of the ISPP operation. This is because threshold voltages of the memory cells are much smaller than the target threshold voltage in the early phase of the ISPP operation. Thus, the first pass-fail result is not generated in the early phase of the ISPP operation. That is, program states of the memory cells are checked based on only the second pass-fail result, so that the non-volatile memory device is able to operate at high speed and have high performance. In this case, the first pass-fail result is not generated by not performing both of the first verify read operation and the first status check operation, or by performing the first verify read operation, but not performing the first status check operation.

In an embodiment, the first pass-fail result is not generated after the increment value of the program voltage is changed (e.g., decreased). This is because all threshold voltages of the memory cells are greater than the first verification voltage after the increment value of the program voltage is changed. Since the first verification voltage is smaller than the second verification voltage, generation of the first pass-fail result may not be needed anymore in a late phase of the ISPP operation. Thus, the first pass-fail result may not be generated in the late phase of the ISPP operation. That is, program states of the memory cells are checked based on the second pass-fail result, so that the non-volatile memory device may operate at high speed and have high performance because the non-volatile memory device does not generate the first pass-fail result in the late phase of the ISPP operation. According to some examples, the first verification voltage is the same as the second verification voltage (e.g., the target threshold voltage). However, the first verification voltage may be smaller than the second verification voltage due to common source line noise.

The increment value of the program voltage is changed (e.g., decreased) based on the first pass-fail result (Step S140), while the ISPP operation is performed based on the program voltage, the first verification voltage, and the second verification voltage (Step S120). The first pass-fail result includes information about the first fail memory cell and the first pass memory cell. The memory cells are identified as first fail memory cells when threshold voltages of the memory cells are smaller than the first verification voltage. The memory cells are identified as first pass memory cells when threshold voltages of the memory cells are greater than the first verification voltage. The increment value of the program voltage is changed (e.g., decreased) when all the memory cells are identified as first pass memory cells based on the first pass-fail result. Then, the program voltage is increased by the increment value (e.g., the decreased increment value), and the program voltage is applied to the memory cells in a next program loop. However, the increment value of the program voltage is maintained when at least one of the memory cells is identified as a first fail memory cell based on the first pass-fail result. Then, the program voltage is increased by the increment value (e.g., the maintained increment value), and the program voltage is applied to the memory cells in a next program loop.

The ISPP operation is finished based on the second pass-fail result (Step S160), while the ISPP operation is performed based on the program voltage, the first verification voltage, and the second verification voltage (Step S120). The second pass-fail result includes information about the second fail memory cell and the second pass memory cell. The memory cells are identified as second fail memory cells when threshold voltages of the memory cells are smaller than the second verification voltage. The memory cells are identified as second pass memory cells when threshold voltages of the memory cells are greater than the second verification voltage. Thus, the ISPP operation ends based on the second pass-fail result. The end of the ISPP operation means that the program loops are no longer performed.

As described above, while the ISPP operation is performed, the memory cells having threshold voltages greater than the second verification voltage (e.g., the target threshold voltage) are not programmed in a next program loop. The ISPP operation is continued when at least one of the memory cells is identified as the second fail memory cell. That is, since a second fail memory cell having a threshold voltage smaller than the second verification voltage (e.g., the target threshold voltage) exists, the next program loop for programming the second fail memory cell needs to be performed. On the other hand, the ISPP operation ends when all memory cells are identified as second pass memory cells. That is, since a second fail memory cell having a threshold voltage smaller than the second verification voltage (e.g., the target threshold voltage) does not exist, the next program loop for programming the second fail memory cell need not be performed. In an embodiment, the ISPP operation may end in a next program loop when the increment value of the program voltage is changed (e.g., decreased) in a current program loop.

When the ISPP operation is performed for the memory cells of the non-volatile memory device, the method of FIG. 1 compensates for errors due to the common source line noise by using the first verification voltage and the second verification voltage, and prevents unnecessary power consumption due to excessive increases of the program voltage by adaptively changing (e.g., decreasing) the increment value of the program voltage. The method of FIG. 1 may be implemented using program commands, for example, stored in a computer readable medium. The program commands may be performed by various computing systems. The computer readable medium may include a magnetic recording medium (e.g., a hard disk, a floppy disk, a magnetic tape, etc), an optical recording medium (e.g., a CD-ROM, a DVD, etc), a magnetic-optical recording medium (e.g., a floptical disk, etc).

Figure 2:
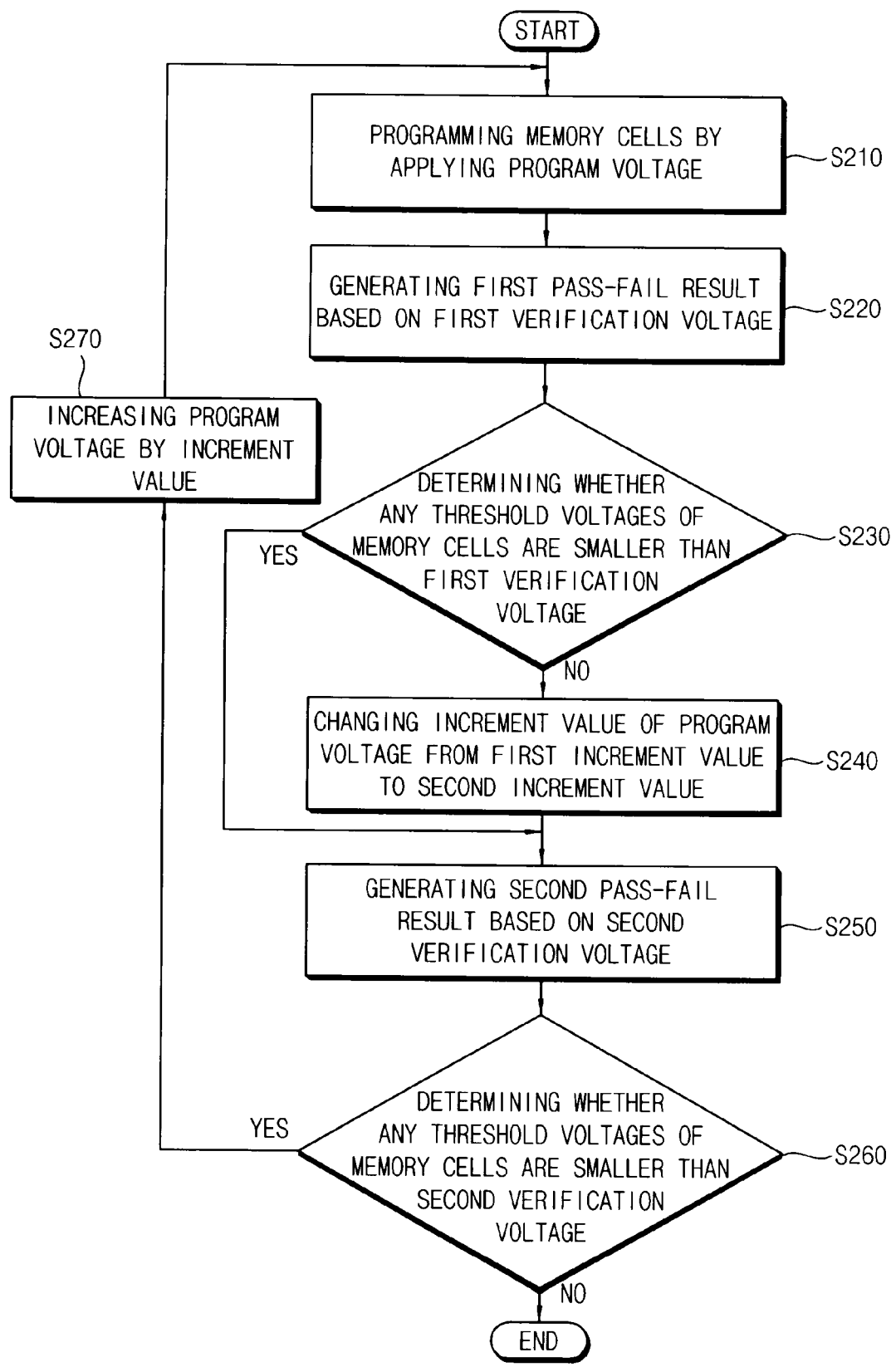
FIG. 2 is a flow chart illustrating a method of FIG. 1 in detail, according to an illustrative embodiment.

FIG. 2 is a flow chart illustrating a method of FIG. 1 in detail, according to an illustrative embodiment.

Referring to FIG. 2, in the method of FIG. 1, the memory cells are programmed when a program voltage is applied to the memory cells (Step S210). The program voltage may be increased by a first increment value every program loop of multiple, consecutive program loops. A first pass-fail result is generated by comparing threshold voltages of the memory cells with a first verification voltage (Step S220). Then, it is verified based on the first pass-fail result, whether any threshold voltages of the memory cells are smaller than the first verification voltage (Step S230). When all threshold voltages of the memory cells are greater than the first verification voltage, the increment value of the program voltage is changed from the first increment value to a second increment value (Step S240). A second pass-fail result is generated by comparing threshold voltages of the memory cells with the second verification voltage (Step S250). Then, it is verified based on the second pass-fail result whether any threshold voltages of the memory cells are smaller than the second verification voltage (Step S260). When all threshold voltages of the memory cells are greater than the second verification voltage, the ISPP operation ends. However, when any threshold voltages of the memory cells are smaller than the second verification voltage, a next program loop is performed for the memory cells having threshold voltages smaller than the second verification voltage after increasing the program voltage by the increment value (i.e., the first increment value, or the second increment value) (Step S270). As described above, in various embodiments, the first verification voltage is smaller than the second verification voltage, and the second verification voltage corresponds to the target threshold voltage.

When the ISPP operation is performed based on the program voltage, the first verification voltage and the second verification voltage, the first pass-fail result is generated by comparing threshold voltages of the memory cells with the first verification voltage every program loop. The first pass-fail result includes information about the first fail memory cell and the first pass memory cell. The memory cells having threshold voltages smaller than the first verification voltage may be identified as first fail memory cells, and the memory cells having threshold voltages greater than the first verification voltage are identified as the first pass memory cells. In an embodiment, the first pass-fail result may be generated after at least one program loop is performed in an early phase of the ISPP operation. That is, the first pass-fail result is not generated in the early phase of the ISPP operation. In an embodiment, the first pass-fail result is not generated after the increment value of the program voltage is changed (e.g., decreased) from the first increment value to the second increment value. That is, only the second pass-fail result may be generated in the late phase of the ISPP operation. As described above, the memory cells may be identified as first fail memory cells, or first pass memory cells, according to the first pass-fail result.

After the first pass-fail result is generated by verifying whether any threshold voltages of the memory cells are smaller than the first verification voltage (i.e., whether one or more first fail memory cells exist), the increment value of the program voltage is changed from the first increment value to the second increment value based on the first pass-fail result. In detail, a next program loop is performed after increasing the program voltage by the first increment value when any threshold voltages of the memory cells are smaller than the first verification voltage (i.e., first fail memory cells exist). In addition, a next program loop is performed after increasing the program voltage by the second increment value when all threshold voltages of the memory cells are greater than the first verification voltage (i.e., first fail memory cells do not exist). Here, the second increment value may be smaller than the first increment value.

When the ISPP operation is performed based on the program voltage, the first verification voltage and the second verification voltage, the second pass-fail result is generated by comparing threshold voltages of the memory cells with the second verification voltage every program loop. The second pass-fail result includes information about the second fail memory cells and the second pass memory cells. The memory cells having threshold voltages smaller than the second verification voltage are identified as second fail memory cells, and the memory cells having threshold voltages greater than the second verification voltage are identified as second pass memory cells.

As described above, the first pass-fail result is not generated after the increment value of the program voltage is changed (e.g., decreased) from the first increment value to the second increment value. That is, the first pass-fail result is not generated in the late phase of the ISPP operation. The memory cells are determined to be second fail memory cells, or second pass memory cells, according to the second pass-fail result.

After the second pass-fail result is generated by verifying whether any threshold voltages of the memory cells are smaller than the second verification voltage (i.e., whether one or more second fail memory cells exist), the ISPP operation ends based on the second pass-fail result. In detail, a next program loop is performed after increasing the program voltage by the second increment value when any threshold voltages of the memory cells are smaller than the second verification voltage (i.e., second fail memory cells exist). In addition, the ISPP operation may end when all threshold voltages of the memory cells are greater than the second verification voltage (i.e., second fail memory cells do not exist). That is, since all memory cells are completely programmed, the ISPP operation may end. The ISPP operation may end in a next program loop when the increment value of the program voltage is changed (e.g., decreased) from the first increment value to the second increment value in a current program loop. According to various embodiments, the first verification voltage may be the same as the second verification voltage (e.g., the target threshold voltage). However, the first verification voltage may be smaller than the second verification voltage due to effects of a common source line noise.

FIGS. 3A through 3F are diagrams illustrating an example in which memory cells are programmed by a method of FIG. 1. For convenience of explanation, the memory cells are assumed to be single level memory cells (SLC). However, it is understood that the method of FIG. 1 likewise may be applied to multi level memory cells (MLC).

Figure 3A:
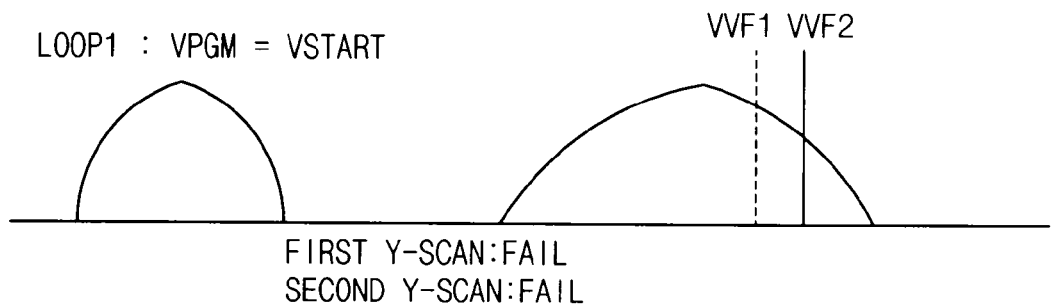
FIGS. 3A through 3F are diagrams illustrating an example in which memory cells are programmed by a method of FIG. 1, according to an illustrative embodiment.

Referring to FIG. 3A, a first program loop LOOP1 is performed. In the first program loop LOOP1, a first program voltage VSTART is applied to word-lines coupled to memory cells as program voltage VPGM. After the memory cells are programmed, program states of the memory cells are verified based on a first verification voltage VVF1 and a second verification voltage VVF2. As illustrated in FIG. 3A, the first verification voltage VVF1 is smaller than the second verification voltage VVF2, and the second verification voltage VVF2 may correspond to a target threshold voltage. Thus, a first pass-fail result FIRST Y-SCAN is determined to be a fail result FAIL, and a second pass-fail result SECOND Y-SCAN is determined to be a fail result FAIL. That is, although the threshold voltages of the memory cells are increased, the memory cells are divided into a first set, a second set and a third set of the memory cells. The first set includes the memory cells (i.e., first fail memory cells) having threshold voltages that are smaller than the first verification voltage VVF1. The second set includes the memory cells (i.e., first pass memory cells and second fail memory cells) having threshold voltages that are between the first verification voltage VVF1 and the second verification voltage VVF2. The third set includes the memory cells (i.e., second pass memory cells) having threshold voltages that are greater than the second verification voltage VVF2.

In an embodiment, the first pass-fail result FIRST Y-SCAN is not generated in an early phase of the ISPP operation (e.g., in early program loops). For example, the first verification read operation and the first status check operation may be omitted. Alternatively, only the first status check operation may be omitted (e.g., the first verification read operation may be performed). Thus, the first verification voltage VVF1 is illustrated as a dotted line in FIG. 3A. In the next program loop, a program prohibit voltage may be applied to bit-lines coupled to the second pass memory cells in order not to program the second pass memory cells. A ground voltage may be applied to bit-lines coupled to the second fail memory cells to program the second fail memory cells.

Figure 3B:
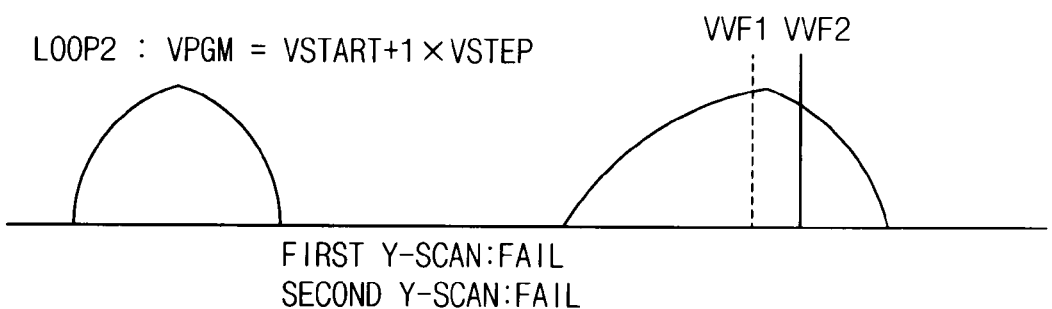

Referring to FIG. 3B, a second program loop LOOP2 is performed after the first program loop LOOP1 ends. In the second program loop LOOP2, a second program voltage VSTART+1*VSTEP is applied as the program voltage VPGM to word-lines coupled to memory cells (i.e., the second fail memory cells), where the increment value of the program voltage VPGM corresponds to a first step pulse voltage VSTEP. After the memory cells are programmed, program states of the memory cells are verified based on the first verification voltage VVF1 and the second verification voltage VVF2.

As illustrated in FIG. 3B, the first pass-fail result FIRST Y-SCAN is still determined to be a fail result FAIL, and the second pass-fail result SECOND Y-SCAN is still determined to be a fail result FAIL. That is, although threshold voltages of the memory cells are increased, the memory cells are still divided into the first set of memory cells (i.e., the first fail memory cells), the second set of memory cells (i.e., the first pass memory cells and the second fail memory cells), and the third set of memory cells (i.e., the second pass memory cells). In an embodiment, the first pass-fail result FIRST Y-SCAN is not generated in an early phase of the ISPP operation (e.g., in early program loops). Thus, the first verification voltage VVF1 is illustrated as a dotted line in FIG. 3B. In a next program loop, a program prohibit voltage may be applied to bit-lines coupled to the second pass memory cells in order not to program the second pass memory cells. A ground voltage may be applied to bit-lines coupled to the second fail memory cells in order to program the second fail memory cells.

Figure 3C:
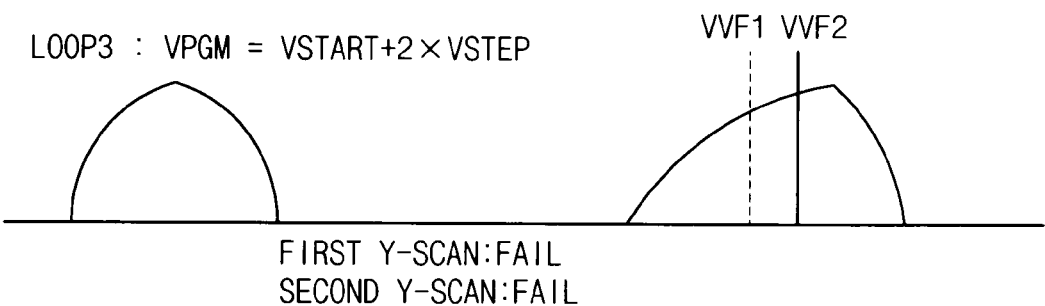

Referring to FIG. 3C, a third program loop LOOP3 is performed after the second program loop LOOP2 ends. In the third program loop LOOP3, a third program voltage VSTART+2*VSTEP is applied as the program voltage VPGM to word-lines coupled to memory cells (i.e., the second fail memory cells), where the increment value of the program voltage VPGM corresponds to the first step pulse voltage VSTEP. After the memory cells are programmed, program states of the memory cells are verified based on the first verification voltage VVF1 and the second verification voltage VVF2.

As illustrated in FIG. 3C, the first pass-fail result FIRST Y-SCAN is still determined to be a fail result FAIL, and the second pass-fail result SECOND Y-SCAN is still determined to be a fail result FAIL. That is, although threshold voltages of the memory cells are increased, the memory cells are still divided into the first set of the memory cells (i.e., the first fail memory cells), the second set of the memory cells (i.e., the first pass memory cells and the second fail memory cells), and the third set of the memory cells (i.e., the second pass memory cells). In an embodiment, the first pass-fail result FIRST Y-SCAN is not generated in an early phase of the ISPP operation (e.g., early program loops). Thus, the first verification voltage VVF1 is illustrated as a dotted line in FIG. 3C. In a next program loop, a program prohibit voltage may be applied to bit-lines coupled to the second pass memory cells in order not to program the second pass memory cells. A ground voltage may be applied to bit-lines coupled to the second fail memory cells in order to program the second fail memory cells.

Figure 3D:
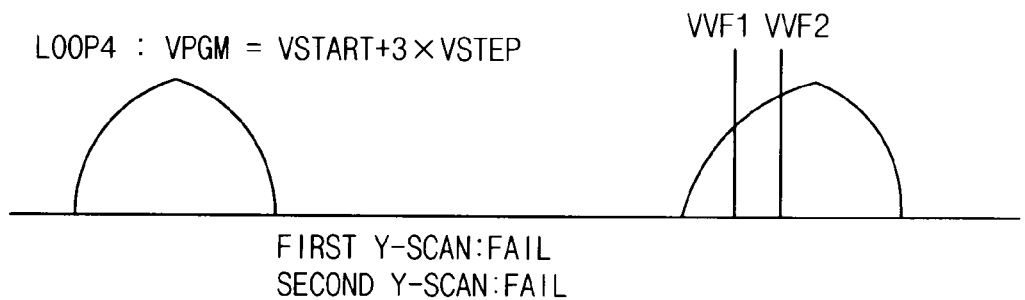

Referring to FIG. 3D, a fourth program loop LOOP4 is performed after the third program loop LOOP3 ends. In the fourth program loop LOOP4, a fourth program voltage VSTART+3*VSTEP is applied as the program voltage VPGM to word-lines coupled to memory cells (i.e., the second fail memory cells), where the increment value of the program voltage VPGM corresponds to the first step pulse voltage VSTEP. After the memory cells are programmed, program states of the memory cells are verified based on the first verification voltage VVF1 and the second verification voltage VVF2.

As illustrated in FIG. 3D, the first pass-fail result FIRST Y-SCAN is still determined to be a fail result FAIL, and the second pass-fail result SECOND Y-SCAN is still determined to be a fail result FAIL. That is, although threshold voltages of the memory cells are increased, the memory cells are still divided into the first set of the memory cells (i.e., the first fail memory cells), the second set of the memory cells (i.e., the first pass memory cells and the second fail memory cells), and the third set of the memory cells (i.e., the second pass memory cells). Here, since the first pass-fail result FIRST Y-SCAN is generated from the fourth program loop LOOP4, the first verification voltage VVF1 is illustrated as a solid line in FIG. 3D. In a next program loop, a program prohibit voltage may be applied to bit-lines coupled to the second pass memory cells in order not to program the second pass memory cells. A ground voltage may be applied to bit-lines coupled to the second fail memory cells in order to program the second fail memory cells.

Figure 3E:
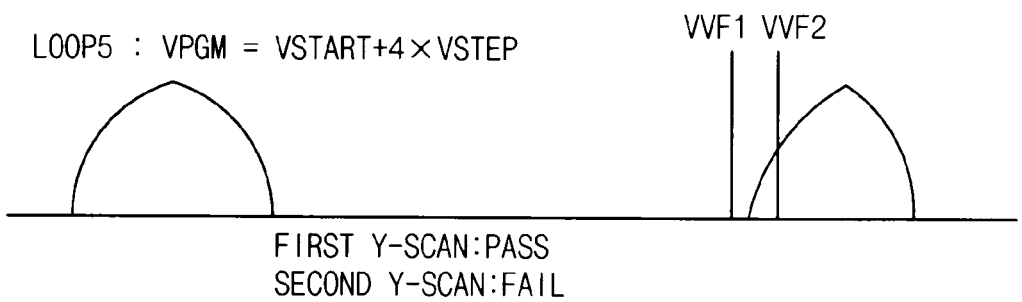

Referring to FIG. 3E, a fifth program loop LOOP5 is performed after the fourth program loop LOOP4 ends. In the fifth program loop LOOP5, a fifth program voltage VSTART+4*VSTEP is applied as the program voltage VPGM to word-lines coupled to memory cells (i.e., the second fail memory cells), where the increment value of the program voltage VPGM corresponds to the first step pulse voltage VSTEP. After the memory cells are programmed, program states of the memory cells are verified based on the first verification voltage VVF1 and the second verification voltage VVF2.

As illustrated in FIG. 3E, the first pass-fail result FIRST Y-SCAN is determined to be a pass result PASS, and the second pass-fail result SECOND Y-SCAN is still determined to be a fail result FAIL. That is, as threshold voltages of the memory cells are increased, the memory cells are divided into the second set of the memory cells (i.e., the first pass memory cells and the second fail memory cells) and the third set of the memory cells (i.e., the second pass memory cells). All threshold voltages of the memory cells are greater than the first verification voltage VVF1 (i.e., all memory cells are determined to be first pass memory cells). Here, since the first pass-fail result FIRST Y-SCAN is generated from the fourth program loop LOOP4, the first verification voltage VVF1 is illustrated as a solid line in FIG. 3E. In a next program loop, a program prohibit voltage may be applied to bit-lines coupled to the second pass memory cells in order not to program the second pass memory cells. A ground voltage may be applied to bit-lines coupled to the second fail memory cells in order to program the second fail memory cells. Since first fail memory cells do not exist, the increment value of the program voltage VPGM may be decreased.

Figure 3F:
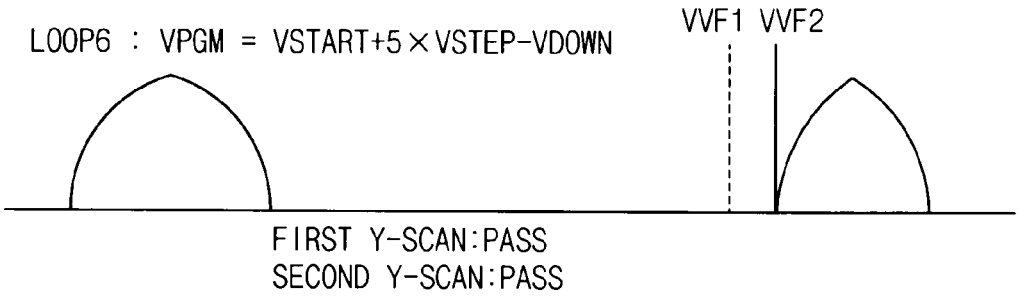

Referring to FIG. 3F, a sixth program loop LOOP6 is performed after the fifth program loop LOOP5 ends. In the sixth program loop LOOP6, a sixth program voltage VSTART+5*VSTEP-VDOWN is applied as the program voltage VPGM to word-lines coupled to memory cells (i.e., the second fail memory cells). The increment value of the program voltage VPGM corresponds to a second step pulse voltage VSTEP-VDOWN. That is, the increment value of the program voltage VPGM is decreased by a predetermined value VDOWN, which is subtracted from the first step pulse voltage VSTEP. After the memory cells are programmed, program states of the memory cells are verified based on the first verification voltage VVF1 and the second verification voltage VVF2.

As illustrated in FIG. 3F, the first pass-fail result FIRST Y-SCAN is determined to be a pass result PASS, and the second pass-fail result SECOND Y-SCAN is determined to be a pass result PASS. That is, as threshold voltages of the memory cells are increased, all of the memory cells are determined to be the second pass memory cell. In an embodiment, the first pass-fail result FIRST Y-SCAN is not generated after the increment value of the program voltage VPGM is decreased. Thus, the first verification voltage VVF1 is illustrated as a dotted line in FIG. 3F. Since all threshold voltages of the memory cells are greater than the second verification voltage VVF2 (e.g., the target threshold voltage), the ISPP operation is finished.

In FIGS. 3A through 3F, it is illustrated that the ISPP operation is finished in a next program loop when the increment value of the program voltage VPGM is decreased in a current program loop. However, the inventive concept is not limited to this implementation. For example, according to required conditions, the ISPP operation may end when multiple program loops are performed after the increment value of the program voltage VPGM is changed. As described above, the method of FIG. 1 may have a dense threshold voltage (Vth) distribution of the memory cells by performing the ISPP operation.

Figure 4:
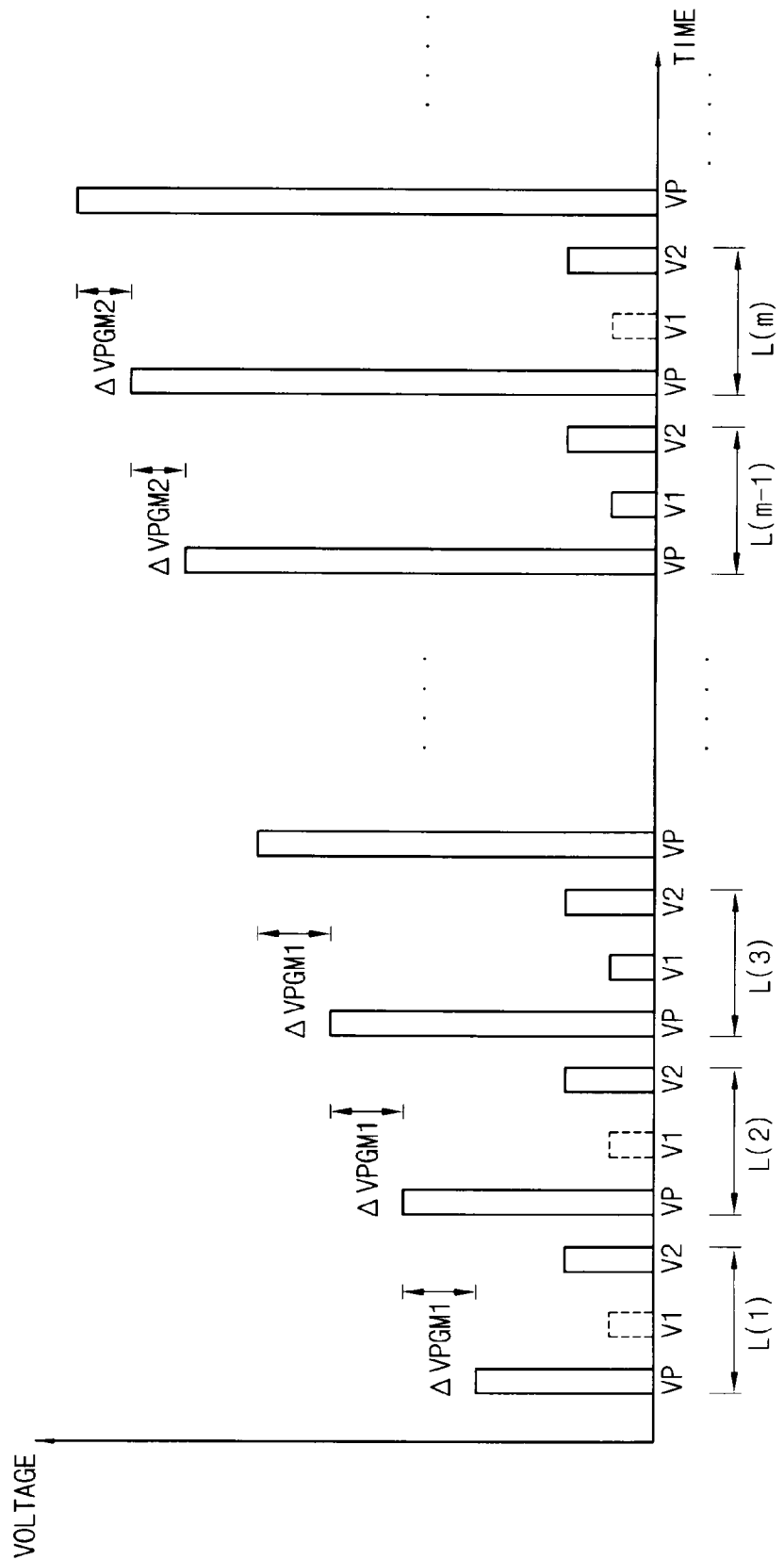
FIG. 4 is a diagram illustrating an example in which a program voltage is applied to memory cells by a method of FIG. 1, according to an illustrative embodiment.

FIG. 4 is a diagram illustrating an example in which a program voltage is applied to memory cells by a method of FIG. 1, according to an illustrative embodiment.

Referring to FIG. 4, the ISPP operation is performed for the memory cells based on program voltage VP, first verification voltage V1, and second verification voltage V2. An increment value of the program voltage VP is changed from a first increment value ΔVPGM1 to a second increment value ΔVPGM2 based on the first pass-fail result. The first pass-fail result is generated by comparing threshold voltages of the memory cells with the first verification voltage V1. In addition, the ISPP operation ends based on the second pass-fail result. The second pass-fail result is generated by comparing threshold voltages of the memory cells with the second verification voltage V2.

In FIG. 4, the X-axis indicates elapsed time of the ISPP operation, and the Y-axis indicates voltages (e.g., the program voltage VP, the first verification voltage V1, and the second verification voltage V2) applied to word-lines coupled to the memory cells. For example, the memory cells are programmed (i.e., a program operation) by applying the program voltage VP to word-lines coupled to the memory cells in a first program loop L(1). Then, threshold voltages of the memory cells are compared with the first verification voltage V1 (i.e., a first verification operation). Subsequently, the threshold voltages of the memory cells are compared with the second verification voltage V2 (i.e., a second verification operation). As described above, after the first program loop L(1) ends, a second program loop L(2) is performed after increasing the program voltage VP by the first increment value ΔVPGM1. Similar to the first program loop L(1), the second program loop L(2) includes the program operation, the first verification operation and the second verification operation. In this manner, third through (m)th program loops L(3) through L(m) may be sequentially performed.

As illustrated in FIG. 4, the program voltage VP increases by the first increment value ΔVPGM1 for each program loop until the (m−2)th program loop L(m−2). After the memory cells are programmed by applying the program voltage VP to word-lines of the memory cells (i.e., the program operation), program states of the memory cells are verified based on the first verification voltage V1 and the second verification voltage V2 (i.e., the first verification operation and the second verification operation). Here, the first verification voltage V1 is smaller than the second verification voltage V2, and the second verification voltage V2 may correspond to a target threshold voltage. As the first verification operation and the second verification operation are sequentially performed, the first pass-fail result and the second pass-fail result are sequentially generated. In a next program loop, the program operation is performed for memory cells (i.e., the second fail memory cells) having threshold voltages smaller than the second verification voltage V2. On the other hand, the program operation is not performed for memory cells (i.e., the second pass memory cells) having threshold voltages greater than the second verification voltage V2. In an embodiment, the first pass-fail result is not generated in an early phase of the ISPP operation (e.g., in early program loops). Thus, the first verification voltage V1 is illustrated as a dotted line in the first program loop L(1) and the second program loop L(2).

After the (m−2)th program loop L(m−2) is performed, all threshold voltages of the memory cells are greater than the first verification voltage V1. Thus, the increment value of the program voltage VP is changed (e.g., decreased) from the first increment value ΔVPGM1 to a second increment value ΔVPGM2. As a result, the program voltage VP is increased by the second increment value ΔVPGM2 for subsequent program loops, the (m−1)th program loop L(m−1) until the ISPP operation is finished. As described above, the first pass-fail result may not be generated after the increment value of the program voltage VP is changed (e.g., decreased) from the first increment value ΔVPGM1 to the second increment value ΔVPGM2. Thus, the first verification voltage V1 is illustrated as a dotted line in the (m)th program loop L(m). In a next program loop, the program operation is performed for memory cells (i.e., the second fail memory cells) having threshold voltages smaller than the second verification voltage V2. On the other hand, the program operation is not performed for memory cells (i.e., the second pass memory cells) having threshold voltages greater than the second verification voltage V2. Finally, the ISPP operation ends when all threshold voltages of the memory cells are greater than the second verification voltage V2.

Generally, when memory cells of a non-volatile memory device are programmed using the ISPP method, threshold voltage distribution is dense when the increment value of the program voltage VP is relatively small, and the number of program loops for the ISPP operation increases when the increment value of the program voltage VP is relatively small. Also, when memory cells of a non-volatile memory device are programmed using the ISPP method, the number of program loops for the ISPP operation decreases when the increment value of the program voltage VP is relatively large, and the threshold voltage distribution is broader when the increment value of the program voltage VP is relatively large. To address these issues, according to various embodiments, the method of FIG. 1 adaptively changes (e.g. decreases) the increment value of the program voltage VP based on the first pass-fail result and the second pass-fail result according to the ISPP operation. As described above, the first pass-fail result is generated by comparing the threshold voltages of the memory cells with the first verification voltage V1, which is smaller than the second verification voltage V2. In addition, the second pass-fail result is generated by comparing the threshold voltages of the memory cells with the second verification voltage V2, which corresponds to the target threshold voltage. Thus, the method of FIG. 1 prevent unnecessary power consumption due to an excessive increases of the program voltage VP, and provides a dense threshold voltage distribution while decreasing the number of program loops.

Figure 5A:
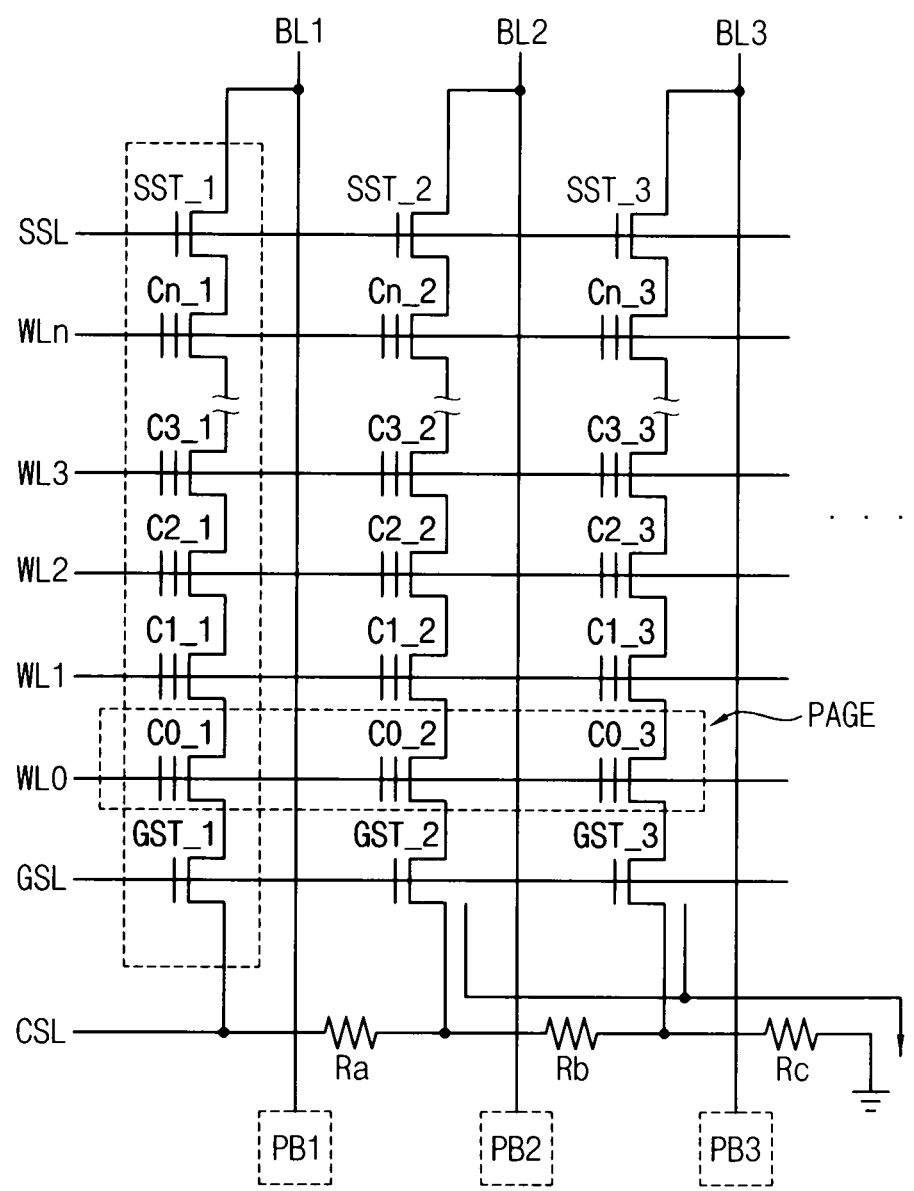
FIGS. 5A through 5C are diagrams illustrating an effect caused by a common source line noise.
Figure 5B:
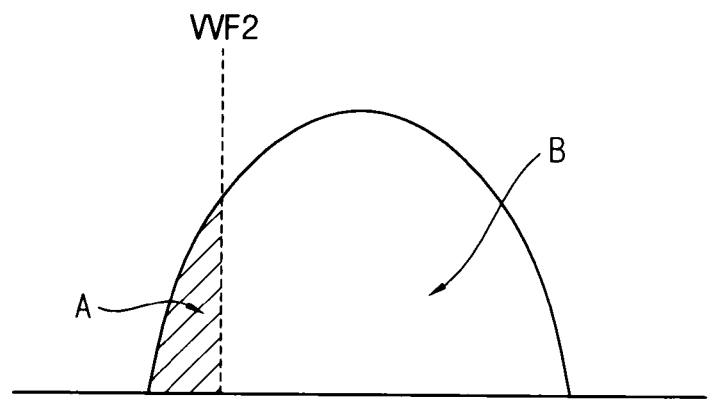
Figure 5C:
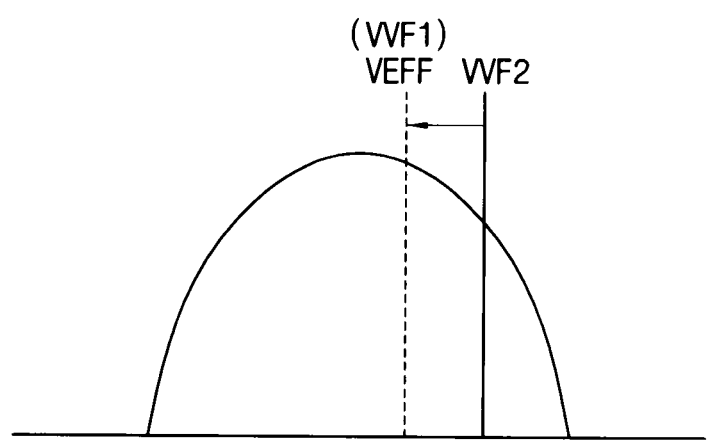

FIGS. 5A through 5C are diagrams illustrating an effect caused by a common source line noise.

Referring to FIG. 5A, a memory cell array in a non-volatile memory device (e.g., a NAND flash memory device) includes multiple memory cell strings formed in a column direction. Each of the memory cell strings includes a string selection transistor SST, memory cells C0 through Cn, and a ground selection transistor GST that are coupled in series. The ground selection transistor GST is coupled to a common source line CSL. A gate terminal of the ground selection transistor GST is coupled to a ground selection line GSL. The string selection transistor SST is coupled to one of bit-lines BL1 through BLm, and a gate terminal of the string selection transistor SST is coupled to a string selection line SSL. Gate terminals of the memory cells C0 through Cn are coupled to word-lines WL0 through WLn, respectively. Memory cells in a word-line direction may constitute one page PAGE. The bit-lines BL1 through BLm may be coupled to page buffers PB1 through PBm, respectively.

When the ISPP operation is performed, a program voltage is applied to one word-line WL0 coupled to selected memory cells C0_1, C0_2, and C0_3, and a pass voltage is applied to other word-lines WL1 through WLn coupled to non-selected memory cells C1 through Cn of each string. In addition, a ground voltage is applied to bit-lines BL1 through BL3 coupled to the selected memory cells C0_1, C0_2, and C0_3, and a program prohibit voltage is applied to the remaining bit-lines (e.g., bit-lines BL4 through BLm (not shown) coupled to the non-selected memory cells (e.g., memory cells C0_4 through C0_m (not shown)). In a program loop, after the selected memory cells C0_1, C0_2, and C0_3 are programmed, it is determined whether threshold voltages of the selected memory cells C0_1, C0_2, and C0_3 are greater than the target threshold voltage. When at least one fail memory cell (e.g., a memory cell having a threshold voltage smaller than the target threshold voltage) exists, a next program loop for the at least one fail memory cell is performed after increasing the program voltage by an increment value. Here, at least one pass memory cell (e.g., a memory cell having a threshold voltage greater than the target threshold voltage) is not programmed in the next program loop by applying the program prohibit voltage to bit-lines coupled to the at least one pass memory cell.

As described above, each of memory cells may have a different threshold voltage transition speed due to manufacturing process errors, aging differences (e.g., degradation differences), and the like. As a result, when the ISPP operation is performed, the memory cells formed in one memory cell array may be divided into fast memory cells for which threshold voltages increase relatively quickly, and slow memory cells for which threshold voltages increase relatively slowly. For example, it may be assumed that the first memory cell C0_1 is a fast memory cell, the second memory cell C0_2 is a slow memory cell, and the third memory cell C0_3 is a slow memory cell. In this case, the threshold voltage of the first memory cell C0_1 may be increased faster than the threshold voltages of the second memory cell C0_2 and the third memory cell C0_3. When program states of the selected memory cells C0_1, C0_2, and C0_3 are verified after the selected memory cells C0_1, C0_2, and C0_3 are programmed, currents flowing through each of the corresponding bit-lines BL1 through BL3 may differ.

In addition, as illustrated in FIG. 5A, the common source line CSL has resistances Ra, Rb, and Rc among the depicted memory cell strings. Thus, a body bias of the first memory cell C0_1 may be increased because a voltage of the common source line CSL increases before a precharge voltage of the first bit-line BL1 is discharged. That is, it seems that a threshold voltage of the first memory cell C0_1 is increased, which may be referred to as common source line noise. As a result, it may be inaccurately determined that the threshold voltage of the first memory cell C0_1 is greater than the target threshold voltage, and thus identified as a pass memory cell, even though the threshold voltage of the first memory cell C0_1 is actually smaller than the target threshold voltage. As a result, the first memory cell C0_1 may not be programmed in subsequent program loops. Finally, the threshold voltage of the first memory cell C0_1 may be smaller than the target threshold voltage when the ISPP operation is finished, which may be referred to as under-program phenomenon.

Referring to FIG. 5B, the under-program phenomenon may be caused by common source line noise. That is, since a body bias of memory cells is increased by the common source line noise, the ISPP operation may end even though some threshold voltages of the memory cells are smaller than the second verification voltage VVF2 (e.g., the target threshold voltage). Thus, after the ISPP operation is finished, the memory cells may be divided into under-programmed memory cells A and normal-programmed memory cells B. As a result, when a non-volatile memory device performs read operations, the under-programmed memory cells A may be determined to be in an erase state, and thus the non-volatile memory device may not have high operation reliability. In addition, a sensing margin of the non-volatile memory device may be decreased by the under-programmed memory cells A. The under-program phenomenon may be caused by resistances of the common source line CSL increasing as the size of the non-volatile memory device becomes smaller, or when the memory cells are MLCs that store multi-bit data, rather than SLCs that store one bit data.

Referring to FIG. 5C, program states of memory cells may be verified based on the first verification voltage VVF1 and the second verification voltage VVF2 after the memory cells are programmed. Thus, the under-program phenomenon, e.g., due to common source line noise may be prevented. As described above, according to various embodiments, the first verification voltage VVF1 is smaller than the second verification voltage VVF2, and the second verification voltage VVF2 may correspond to the target threshold voltage. Program states of the memory cells may be first verified based on the first verification voltage VVF1. Then, program states of the memory cells may be verified based on the second verification voltage VVF2. Since program states of the memory cells are verified based on multiple verification voltages (e.g., the first verification voltage VVF1 and the second verification voltage VVF2), errors due to common source line noise, for example, are reduced. Thus, the method of FIG. 1 efficiently prevents the under-program phenomenon due to the common source line noise.

In an embodiment, the first verification voltage VVF1 may be the same as the target threshold voltage (and thus the second verification voltage VVF2). However, as described above, common source line noise may result in the first verification voltage VVF1 being smaller than the target threshold voltage. For example, when the first verification voltage VVF1 is set to be the target threshold voltage, a body bias of memory cells may be increased by the common source line noise. As a result, the first verification voltage VVF1 may act as an effective voltage VEFF that is smaller than the target threshold voltage. This phenomenon may be caused during early phases of the ISPP operation (e.g., early program loops) because a relatively large current flows through bit-lines during the early program loops. On the other hand, this phenomenon rarely occurs during later phases of the ISPP operation (e.g., late program loops) because a relatively small current flows through bit-lines during the late program loops. Thus, even when the first verification voltage VVF1 is intended to be the same as the target threshold voltage (and thus the second verification voltage VVF2), the first verification voltage VVF1 may act as if the first verification voltage VVF1 is smaller than the target threshold voltage.

Figure 6:
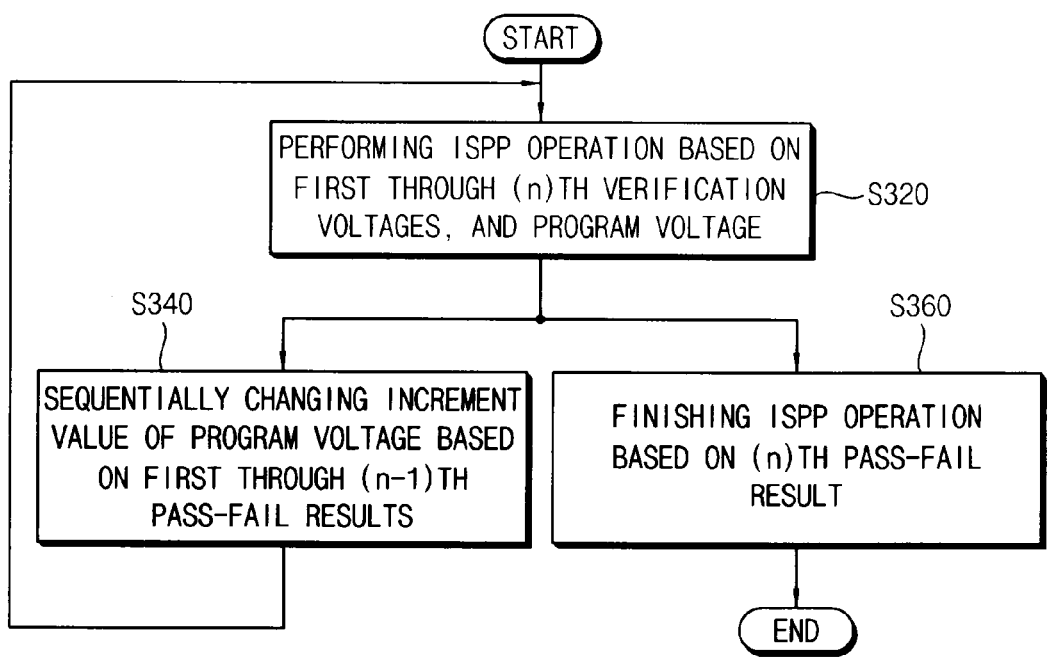
FIG. 6 is a flow chart illustrating a method of programming memory cells of a non-volatile memory device, according to illustrative embodiments.

FIG. 6 is a flow chart illustrating a method of programming memory cells for a non-volatile memory device, according to illustrative embodiments.

Referring to FIG. 6, an ISPP operation is performed for the memory cells based on a program voltage, and first through (n)th verification voltages (Step S320), where n is a positive integer greater than one. Here, an increment value of the program voltage is sequentially changed from a first increment value to a (n−1)th increment value based on first through (n−1)th pass-fail results (Step S340). The first through (n−1)th pass-fail results are generated by comparing threshold voltages of the memory cells with each of the first through (n−1)th verification voltages. The ISPP operation ends based on a (n)th pass-fail result (Step S360). The (n)th pass-fail result is generated by comparing threshold voltages of the memory cells with the (n)th verification voltage.

The method of FIG. 6 performs the ISPP operation based on the program voltage, and the first through (n)th verification voltages. That is, when multiple program loops are performed, program states of the memory cells are checked based on the first through (n)th verification voltages. The method of FIG. 6 sequentially changes (e.g., decreases) the increment value of the program voltage based on program states of the memory cells while compensating for errors due to a common source line noise. Hereinafter, the method of FIG. 6 will be described in detail, according to various embodiments. For convenience of explanation, the memory cells are assumed to be SLCs that store one bit data. However, it is understood that the method of FIG. 6 likewise may be applied to MLCs that store multi-bit data.

Referring to FIG. 6, the ISPP operation is performed for the memory cells based on the program voltage, and the first through (n)th verification voltages (Step S320). In an embodiment, the memory cells may be programmed by the F-N tunneling effect in each of multiple program loops. The F-N tunneling effect may be caused to occur for a predetermined time by applying the ground voltage to bit-lines coupled to the selected memory cells, by applying the program prohibition voltage to bit-lines coupled to the non-selected memory cells, by applying the power voltage to the string selection line, by applying the program voltage to word-lines coupled to the selected memory cells, and by applying the pass voltage to word-lines coupled to the non-selected memory cells. Then, it is verified whether threshold voltages of the memory cells are greater than the target threshold voltage based on the first through (n)th pass-fail results. As described above, the first through (n)th pass-fail results are generated by comparing threshold voltages of the memory cells with the first through (n)th verification voltages, respectively.

When program states of the memory cells are checked based on the first through (n)th verification voltage, the memory cells having threshold voltages smaller than the first through (n)th verification voltages are determined to be first through (n)th fail memory cells, respectively. In addition, the memory cells having threshold voltages greater than the first through (n)th verification voltages are determined to be first through (n)th pass memory cells, respectively. Thus, the first through (n)th pass-fail results include information about fail memory cells (i.e., the first through (n)th fail memory cells) and pass memory cells (i.e., the first through (n)th pass memory cells), respectively. In an embodiment, the first through (n)th verification voltages may be greater as n increases, and the (n)th verification voltage may correspond to the target threshold voltage. In another embodiment, the first through (n)th verification voltages may correspond to the target threshold voltage. In this case, the first through (n)th verification voltages may be substantially greater as n increases because common source line noise is caused. As described above, the method of FIG. 6 checks program states of the memory cells based on multiple verification voltages (i.e., the first through (n)th verification voltages). Thus, the method of FIG. 6 finds adequate periods during which changing (e.g., decreasing) the increment value of the program voltage is available, and changes (e.g., decreases) the increment of the program voltage during the adequate periods to prevent unnecessary power consumption due to an excessive increases of the program voltage.

The first pass-fail result is generated by performing a first verify read operation for reading threshold voltages of the memory cells, and by performing a first status check operation for comparing threshold voltages of the memory cells with the first verification voltage. The second pass-fail result is generated by performing a second verify read operation for reading threshold voltages of the memory cells, and by performing a second status check operation for comparing threshold voltages of the memory cells with the second verification voltage. Similarly, third through (n)th pass-fail results are generated by performing verify read operations and status check operations, respectively. For example, the first through (n)th status check operations may be performed using a column scan pass/fail check method, a wired-OR pass/fail check method, or the like. Generation of the first through (n)th pass-fail results may be omitted according to required conditions. In an embodiment, some pass-fail results may not be generated in an early phase of the ISPP operation because threshold voltages of the memory cells are much smaller than the target threshold voltage in the early phase of the ISPP operation. For example, the first through (n−1)th pass-fail result may not be generated in the first program loop, the first through (n−2)th pass-fail result may not be generated in the second program loop, and the first through (n−3)th pass-fail result may not be generated in the third program loop.

Similarly, in an example embodiment, some pass-fail results may not be generated in a late phase of the ISPP operation because threshold voltages of the memory cells are greater than some verification voltages after the increment value of the program voltage is sequentially changed. For example, the first pass-fail result may not be generated after the increment value of the program voltage is changed from a first increment to a second increment, the first and second pass-fail result may not be generated after the increment value of the program voltage is changed from the second increment to a third increment, and the first through third pass-fail result may not be generated after the increment value of the program voltage is changed from the third increment to a fourth increment. As described above, the method of FIG. 6 may selectively generate the first through (n)th pass-fail results according to phases of the ISPP operation. Thus, a non-volatile memory device employing the method of FIG. 6 may operate at high speed and have high performance.

The increment value of the program voltage sequentially changes (e.g., decreases) from the first increment to the (n−1)th increment based on the first through (n−1)th pass-fail results (Step S340), while the ISPP operation is performed based on the program voltage, and the first through (n)th verification voltages (Step S320). The first through (n−1)th increment values may be smaller as (n) increases. For example, the first pass-fail result may include information about the first fail memory cell having a threshold voltage smaller than the first verification voltage, and the first pass memory cell having a threshold voltage greater than the first verification voltage. Thus, the method of FIG. 6 decreases the increment value of the program voltage from the first increment value to the second increment value based on the first pass-fail result (i.e., when all memory cells are determined to be first pass memory cells). In this way, the method of FIG. 6 sequentially changes the increment value of the program voltage from the first increment value to the (n−1)th increment value based on the first through (n−1)th pass-fail results.

The ISPP operation ends based on the (n)th pass-fail result (Step S360), while the ISPP operation is performed based on the program voltage, and the first through (n)th verification voltages (Step S320). The (n)th pass-fail result includes information about the (n)th fail memory cells and the (n)th pass memory cells. The memory cells are determined to be the (n)th fail memory cell when threshold voltages of the memory cells are smaller than the (n)th verification voltage. The memory cells are determined to be the (n)th pass memory cell when threshold voltages of the memory cells are greater than the (n)th verification voltage. Thus, the ISPP operation ends based on the (n)th pass-fail result. Here, the end of the ISPP operation means that program loops do not need to be performed anymore. As described above, while the ISPP operation is performed, the memory cells having threshold voltages greater than the (n)th verification voltage (e.g., the target threshold voltage) are not programmed in a next program loop. The ISPP operation continues when at least one of the memory cells is determined to be the (n)th fail memory cell. That is, since the (n)th fail memory cell having a threshold voltage smaller than the (n)th verification voltage (e.g., the target threshold voltage) exists, the next program loop for programming the (n)th fail memory cell needs to be performed. On the other hand, the ISPP operation ends when all memory cells are determined to be (n)th pass memory cells. That is, since an (n)th fail memory cell having a threshold voltage smaller than the (n)th verification voltage (e.g., the target threshold voltage) does not exist, the next program loop for programming the (n)th fail memory cell need not be performed. In an embodiment, the ISPP operation may end in a next program loop when the increment value of the program voltage is changed (e.g., decreased) from the (n−2)th increment value to the (n−1)th increment value in a current program loop.

When the ISPP operation is performed for the memory cells of the non-volatile memory device, the method of FIG. 6 compensates for errors due to common source line noise, for example, by using the first through (n)th verification voltages, and prevents unnecessary power consumption due to excessive increases of the program voltage by adaptively changing (e.g., decreasing) the increment value of the program voltage. The method of FIG. 6 may be implemented by program commands stored in a computer readable medium, for example. The program commands may be performed by various computing systems. The computer readable medium may include a magnetic recording medium (e.g., a hard disk, a floppy disk, a magnetic tape, etc), an optical recording medium (e.g., a CD-ROM, a DVD, etc), a magnetic-optical recording medium (e.g., a floptical disk, etc), or the like.

Figure 7A:
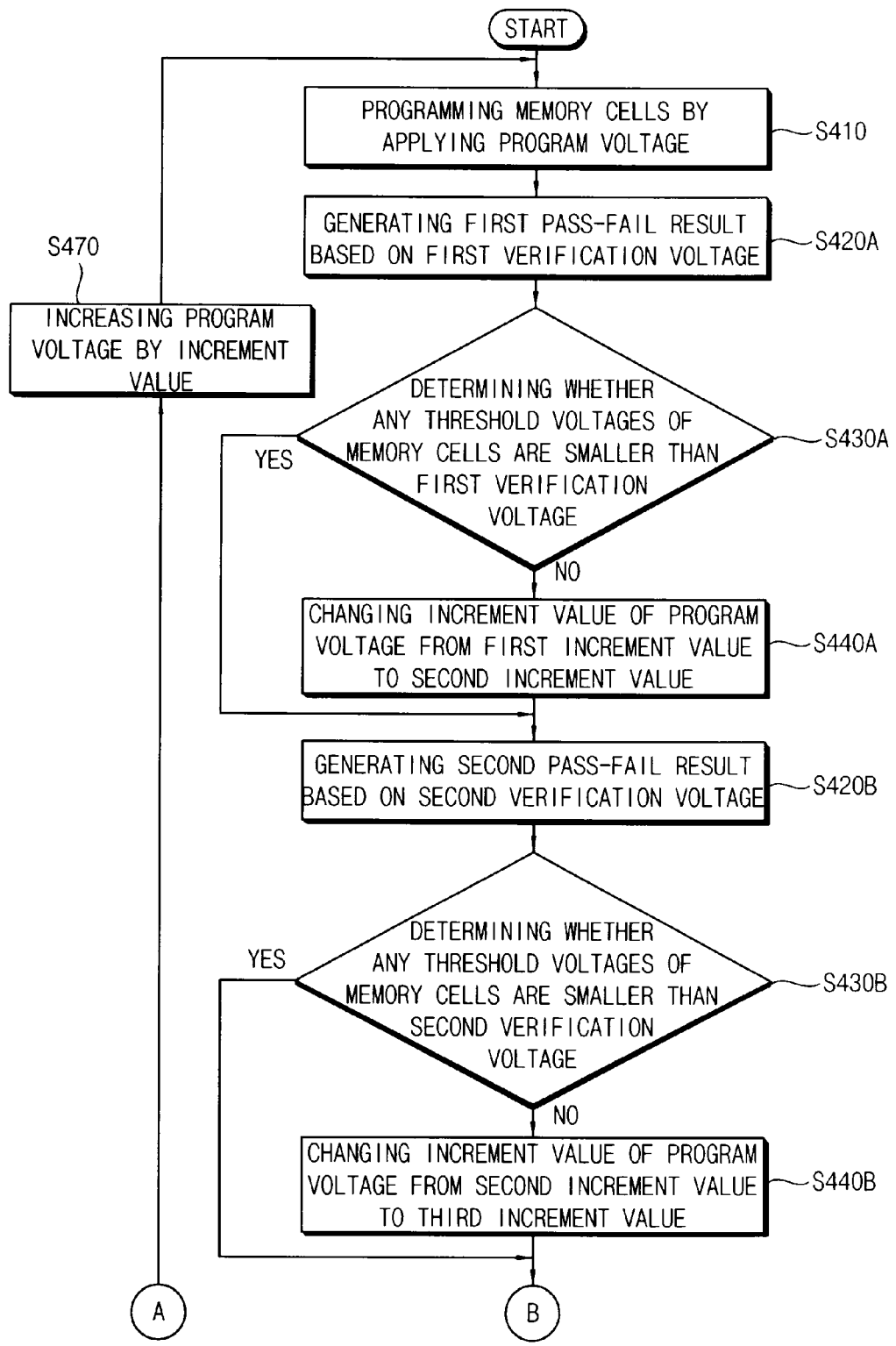
FIGS. 7A and 7B are flow charts illustrating a method of FIG. 6 in detail, according to an illustrative embodiment.
Figure 7B:
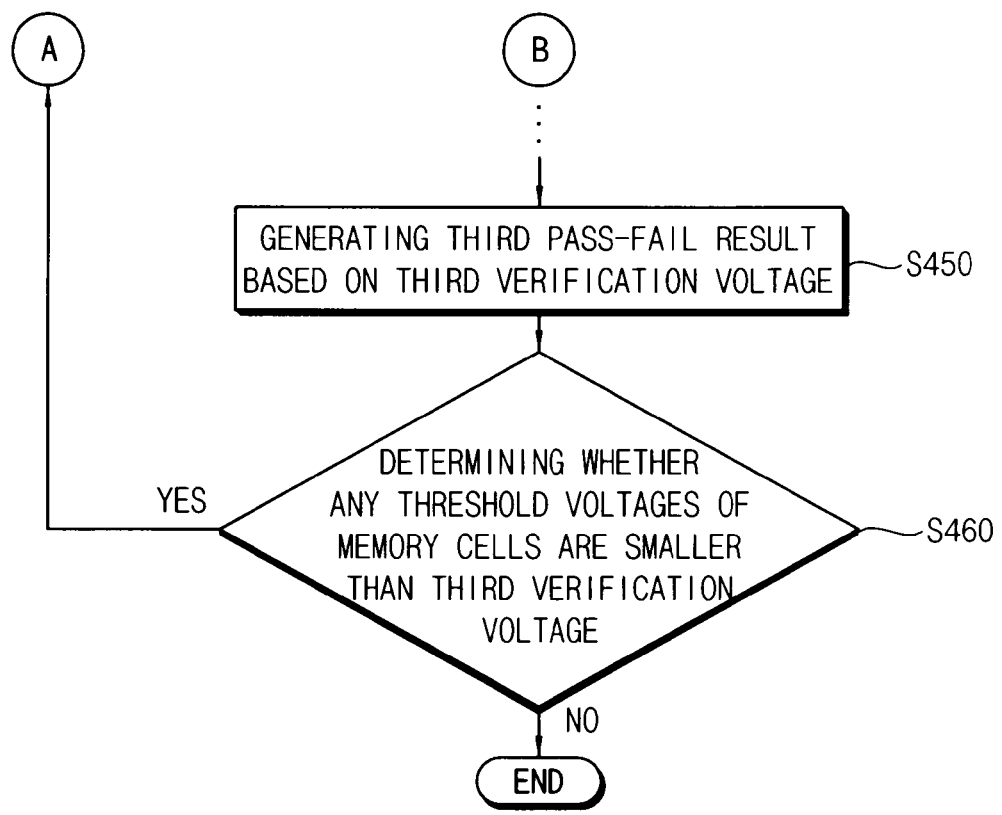

FIGS. 7A and 7B are flow charts illustrating a method of FIG. 6 in detail, according to an illustrative embodiment. For convenience of explanation, it is assumed that (n) is equal to three, such that the memory cells are programmed using first through third verification voltages, for example, although it is understood that (n) may be equal to other positive integers without departing from the scope of the present teachings.

Referring to FIGS. 7A and 7B, the memory cells are programmed when the program voltage is applied to the memory cells (Step S410). The program voltage is increased by a first increment value for each of multiple program loops. The first pass-fail result is generated by comparing threshold voltages of the memory cells with the first verification voltage (Step S420A). Then, it is determined based on the first pass-fail result whether any threshold voltages of the memory cells are smaller than the first verification voltage (Step S430A). When no threshold voltages of the memory cells are smaller than the first verification voltage, the increment value of the program voltage is changed from the first increment value to the second increment value (Step S440A).

In addition, the second pass-fail result is generated by comparing threshold voltages of the memory cells with the second verification voltage (Step S420B). Then, it is determined based on the second pass-fail result whether any threshold voltages of the memory cells are smaller than the second verification voltage (Step S430B). When no threshold voltages of the memory cells are less than the second verification voltage, the increment value of the program voltage is changed from the second increment value to the third increment value (Step S440B). The third pass-fail result is generated by comparing threshold voltages of the memory cells with the third verification voltage. (Step S450). Then, it is determined based on the third pass-fail result whether any threshold voltages of the memory cells are smaller than the third verification voltage (Step S460). When no threshold voltages of the memory cells are less than the third verification voltage, the ISPP operation ends. However, when any threshold voltages of the memory cells are smaller than the third verification voltage, a next program loop is performed for the memory cells having threshold voltages smaller than the third verification voltage after increasing the program voltage by the increment value (e.g., the first increment value, the second increment value, or the third increment value) (Step S470). As described above, the first verification voltage is smaller than the second verification voltage, the second verification voltage is smaller than the third verification voltage, and the third verification voltage may correspond to the target threshold voltage.

When the ISPP operation is performed based on the program voltage, the first verification voltage, the second verification voltage, and the third verification voltage, the first pass-fail result may be generated by comparing threshold voltages of the memory cells with the first verification voltage each program loop. The first pass-fail result includes information about the first fail memory cells and the first pass memory cells. The memory cells having threshold voltages smaller than the first verification voltage are determined to be the first fail memory cells, and the memory cells having threshold voltages greater than the first verification voltage are determined to be the first pass memory cells. In an embodiment, the first pass-fail result is generated after at least one program loop is performed in an early phase of the ISPP operation. In an embodiment, the first pass-fail result is not generated after the increment value of the program voltage is changed (e.g., decreased) from the first increment value to the second increment value. As described above, the memory cells may be determined to be the first fail memory cells, or the first pass memory cells according to the first pass-fail result.

After the first pass-fail result is generated by determining whether any threshold voltages of the memory cells are smaller than the first verification voltage (i.e., whether first fail memory cells exist), the increment value of the program voltage may be changed from the first increment value to the second increment value based on the first pass-fail result. In detail, a next program loop is performed after increasing the program voltage by the first increment value when any threshold voltages of the memory cells are smaller than the first verification voltage (i.e., first fail memory cells exist). In addition, a next program loop is performed after increasing the program voltage by the second increment value when all threshold voltages of the memory cells are greater than the first verification voltage (i.e., first fail memory cells do not exist), and when any threshold voltages of the memory cells are smaller than the second verification voltage (i.e., second fail memory cells exist).

When the ISPP operation is performed based on the program voltage, the first verification voltage, the second verification voltage, and the third verification voltage, the second pass-fail result is generated by comparing threshold voltages of the memory cells with the second verification voltage every program loops. The second pass-fail result includes information about second fail memory cells and second pass memory cells. The memory cells having threshold voltages smaller than the second verification voltage are determined to be second fail memory cells, and the memory cells having threshold voltages greater than the second verification voltage are determined to be second pass memory cells. In an embodiment, the second pass-fail result is generated after at least one program loop is performed in an early phase of the ISPP operation. In an embodiment, the second pass-fail result is not generated after the increment value of the program voltage is changed (e.g., decreased) from the second increment value to the third increment value. As described above, the memory cells are determined to be second fail memory cells, or second pass memory cells according to the second pass-fail result.

After the second pass-fail result is generated by determining whether any threshold voltages of the memory cells are smaller than the second verification voltage (i.e., whether second fail memory cells exist), the increment value of the program voltage is changed from the second increment value to the third increment value based on the second pass-fail result. In detail, a next program loop is performed after increasing the program voltage by the second increment value when any threshold voltages of the memory cells are smaller than the second verification voltage (i.e., second fail memory cells exist), and when all threshold voltages of the memory cells are greater than the first verification voltage (i.e., first fail memory cells do not exist). In addition, a next program loop is performed after increasing the program voltage by the third increment value when all threshold voltages of the memory cells are greater than the second verification voltage (i.e., second fail memory cells do not exist).

When the ISPP operation is performed based on the program voltage, the first verification voltage, the second verification voltage, and the third verification voltage, the third pass-fail result is generated by comparing threshold voltages of the memory cells with the third verification voltage each program loop. The third pass-fail result includes information about third fail memory cells and third pass memory cells. The memory cells having threshold voltages smaller than the third verification voltage are determined to be third fail memory cells, and the memory cells having threshold voltages greater than the third verification voltage are determined to be third pass memory cells. As described above, in an embodiment, the first and second pass-fail results may not be generated after the increment value of the program voltage is changed (e.g., decreased) from the second increment value to the third increment value. That is, only the third pass-fail result may be generated in the late phase of the ISPP operation. The memory cells may be determined to be third fail memory cells, or third pass memory cells according to the third pass-fail result.

After the third pass-fail result is generated by determining whether any threshold voltages of the memory cells are smaller than the third verification voltage (i.e., whether third fail memory cells exist), the ISPP operation ends based on the third pass-fail result. In detail, a next program loop is performed after increasing the program voltage by the third increment value when any threshold voltages of the memory cells are smaller than the third verification voltage (i.e., third fail memory cells exist). In addition, the ISPP operation ends when all threshold voltages of the memory cells are greater than the third verification voltage (i.e., third fail memory cells do not exist). That is, since all memory cells are completely programmed, the ISPP operation may end. The ISPP operation may end in a next program loop when the increment value of the program voltage is changed (e.g., decreased) from the second increment value to the third increment value in a current program loop. According to an embodiment, the first through third verification voltages may be the same as the target threshold voltage. However, the first through third verification voltages may be substantially smaller due to effects of common source line noise as (n) increases.

FIGS. 8A through 8F are diagrams illustrating an example in which memory cells are programmed by a method of FIG. 6, according to an illustrative embodiment. For convenience of explanation, the memory cells are assumed to be SLCs. However, the method of FIG. 6 may be applied to MLCs, as well.

Figure 8A:
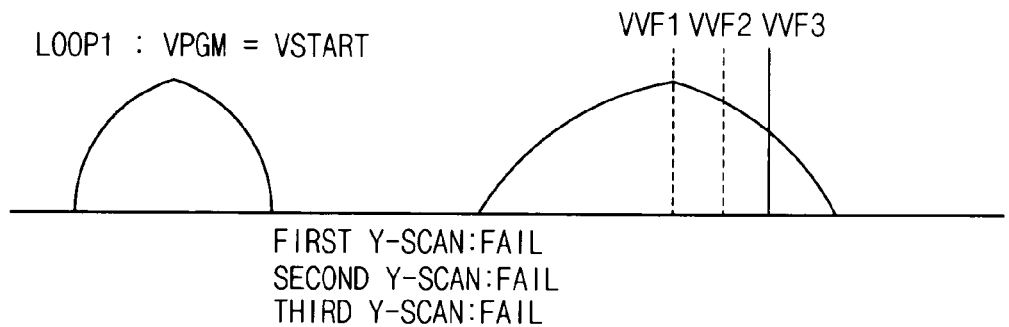
FIGS. 8A through 8F are diagrams illustrating an example in which memory cells are programmed by a method of FIG. 6, according to an illustrative embodiment.

Referring to FIG. 8A, a first program loop LOOP1 is performed. In the first program loop LOOP1, a first program voltage VSTART is applied as a program voltage VPGM to word-lines coupled to memory cells. After the memory cells are programmed, program states of the memory cells are verified based on a first verification voltage VVF1, a second verification voltage VVF2, and a third verification voltage VVF3. As illustrated in FIG. 8A, the first verification voltage VVF1 is smaller than the second verification voltage VVF2, the second verification voltage VVF2 is smaller than the third verification voltage VVF3, and the third verification voltage VVF3 may correspond to a target threshold voltage. Thus, a first pass-fail result FIRST Y-SCAN is determined to be a fail result FAIL, a second pass-fail result SECOND Y-SCAN is determined to be a fail result FAIL, and a third pass-fail result THIRD Y-SCAN is determined to be a fail result FAIL. That is, although threshold voltages of the memory cells are increased, the memory cells are divided into first, second, third and fourth sets of memory cells. The first set includes memory cells (i.e., first fail memory cells) having threshold voltages that are smaller than the first verification voltage VVF1. The second set includes memory cells (i.e., first pass memory cells and second fail memory cells) having threshold voltages that are between the first verification voltage VVF1 and the second verification voltage VVF2. The third set includes memory cells (i.e., second pass memory cells and third fail memory cells) having threshold voltages that are between the second verification voltage VVF2 and the third verification voltage VVF3. The fourth set includes memory cells (i.e., third pass memory cells) having threshold voltages that are greater than the third verification voltage VVF3.

In an embodiment, the first pass-fail result FIRST Y-SCAN and the second pass-fail result SECOND Y-SCAN may not be generated in early phases of the ISPP operation (e.g., early program loops). Thus, the first verification voltage VVF1 and the second verification voltage VVF2 are illustrated as dotted lines in FIG. 8A. In a next program loop, a program prohibit voltage may be applied to bit-lines coupled to the third pass memory cells in order not to program the third pass memory cells. A ground voltage may be applied to bit-lines coupled to the third fail memory cells in order to program the third fail memory cells.

Figure 8B:
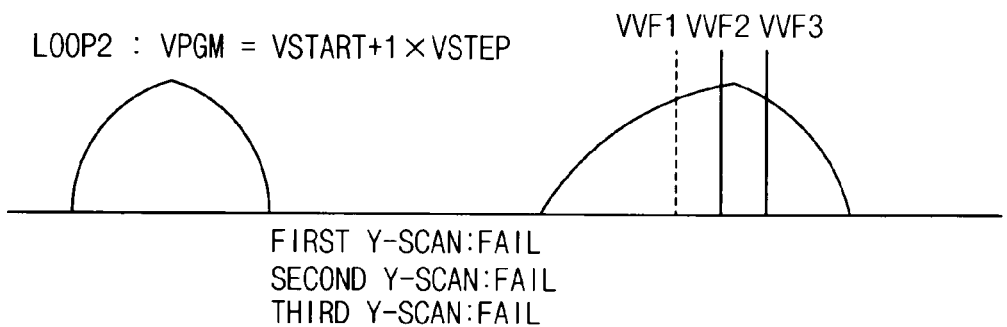

Referring to FIG. 8B, a second program loop LOOP2 is performed after the first program loop LOOP1 ends. In the second program loop LOOP2, a second program voltage VSTART+1*VSTEP is applied as the program voltage VPGM to word-lines coupled to memory cells (i.e., the third fail memory cells), where the increment value of the program voltage VPGM corresponds to a first step pulse voltage VSTEP. After the memory cells are programmed, program states of the memory cells are verified based on the first verification voltage VVF1, the second verification voltage VVF2, and the third verification voltage VVF3.

As illustrated in FIG. 8B, the first pass-fail result FIRST Y-SCAN is still determined to be a fail result FAIL, the second pass-fail result SECOND Y-SCAN is still determined to be a fail result FAIL, and the third pass-fail result THIRD Y-SCAN is still determined to be a fail result FAIL. That is, although threshold voltages of the memory cells are increased, the memory cells are still divided into the first set of the memory cells (i.e., first fail memory cells), the second set of the memory cells (i.e., first pass memory cells and second fail memory cells), the third set of the memory cells (i.e., second pass memory cells and third fail memory cells), and the fourth set of the memory cells (i.e., third pass memory cells). In an embodiment, the first pass-fail result FIRST Y-SCAN may not be generated in early phases of the ISPP operation (e.g., in early program loops). Thus, the first verification voltage VVF1 is illustrated as a dotted line in FIG. 8B. However, since the second pass-fail result SECOND Y-SCAN is generated from the second program loop LOOP2, the second verification voltage VVF2 is illustrated as a solid line in FIG. 8B. In a next program loop, a program prohibit voltage may be applied to bit-lines coupled to the third pass memory cells in order not to program the third pass memory cells. A ground voltage may be applied to bit-lines coupled to the third fail memory cells in order to program the third fail memory cells.

Figure 8C:
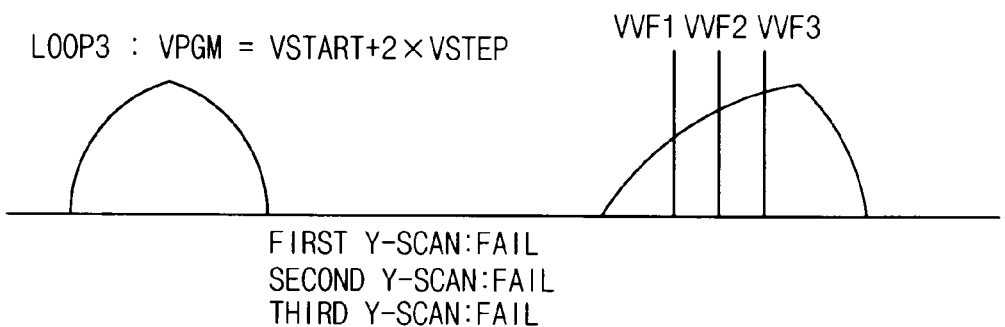

Referring to FIG. 8C, a third program loop LOOP3 is performed after the second program loop LOOP2 ends. In the third program loop LOOP3, a third program voltage VSTART+2*VSTEP is applied as the program voltage VPGM to word-lines coupled to memory cells (i.e., the third fail memory cells), where the increment value of the program voltage VPGM corresponds to the first step pulse voltage VSTEP. After the memory cells are programmed, program states of the memory cells are verified based on the first verification voltage VVF1, the second verification voltage VVF2, and the third verification voltage VVF3.

As illustrated in FIG. 8C, the first pass-fail result FIRST Y-SCAN is still determined to be a fail result FAIL, the second pass-fail result SECOND Y-SCAN is still determined to be a fail result FAIL, and the third pass-fail result THIRD Y-SCAN is still determined to be a fail result FAIL. That is, although threshold voltages of the memory cells are increased, the memory cells are still divided into the first set of the memory cells (i.e., first fail memory cells), the second set of the memory cells (i.e., first pass memory cells and second fail memory cells), the third set of the memory cells (i.e., second pass memory cells and third fail memory cells), and the fourth set of the memory cells (i.e., third pass memory cells). Since the first pass-fail result FIRST Y-SCAN is generated from the third program loop LOOP3, the first verification voltage VVF1 is illustrated as a solid line in FIG. 8C. In a next program loop, a program prohibit voltage may be applied to bit-lines coupled to the third pass memory cells in order not to program the third pass memory cells. A ground voltage may be applied to bit-lines coupled to the third fail memory cells in order to program the third fail memory cells.

Figure 8D:
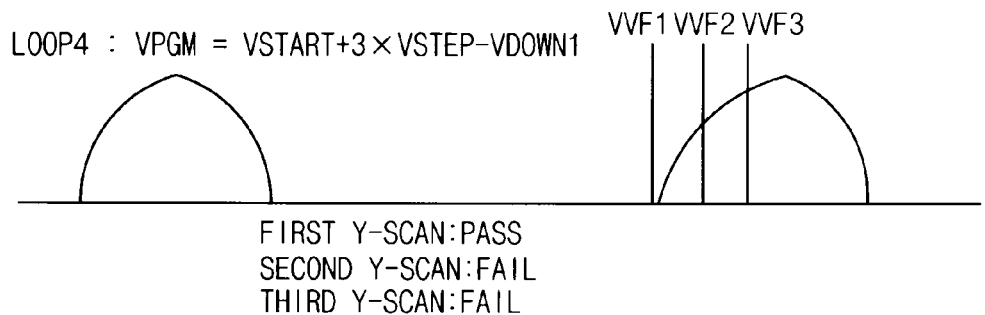

Referring to FIG. 8D, a fourth program loop LOOP4 is performed after the third program loop LOOP3 ends. In the fourth program loop LOOP4, a fourth program voltage VSTART+3*VSTEP-VDOWN1 is applied as the program voltage VPGM to word-lines coupled to memory cells (i.e., the third fail memory cells). The increment value of the program voltage VPGM corresponds to a second step pulse voltage VSTEP-VDOWN1. That is, the increment value of the program voltage VPGM is decreased by a predetermined value VDOWN1, which is subtracted from the first step pulse voltage VSTEP. After the memory cells are programmed, program states of the memory cells are verified based on the first verification voltage VVF1, the second verification voltage VVF2, and the third verification voltage VVF3.

As illustrated in FIG. 8D, the first pass-fail result FIRST Y-SCAN is determined to be a pass result PASS, the second pass-fail result SECOND Y-SCAN is still determined to be a fail result FAIL, and the third pass-fail result THIRD Y-SCAN is still determined to be a fail result FAIL. That is, as threshold voltages of the memory cells are increased, the memory cells are divided into the second set of the memory cells (i.e., first pass memory cells and second fail memory cells), the third set of the memory cells (i.e., second pass memory cells and third fail memory cells), and the fourth set of the memory cells (i.e., third pass memory cells). In a next program loop, a program prohibit voltage may be applied to bit-lines coupled to the third pass memory cells in order not to program the third pass memory cells. A ground voltage may be applied to bit-lines coupled to the third fail memory cells in order to program the third fail memory cells.

Figure 8E:
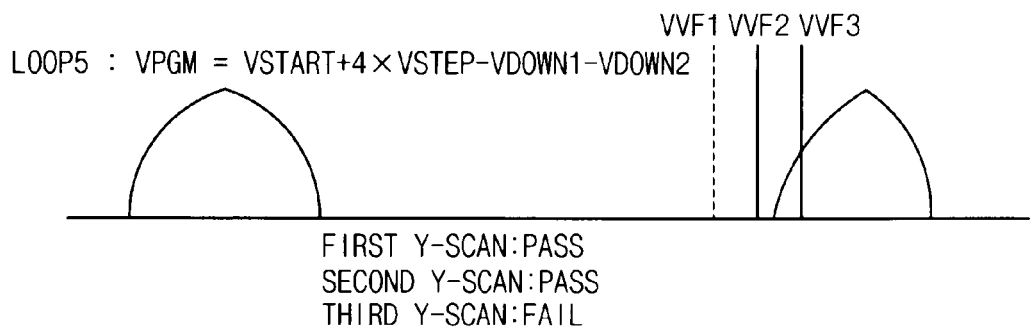

Referring to FIG. 8E, a fifth program loop LOOP5 is performed after the fourth program loop LOOP4 ends. In the fifth program loop LOOP5, a fifth program voltage VSTART+4*VSTEP-VDOWN1-VDOWN2 is applied as the program voltage VPGM to word-lines coupled to memory cells (i.e., the third fail memory cells). The increment value of the program voltage VPGM corresponds to a third step pulse voltage VSTEP-VDOWN2. That is, the increment value of the program voltage VPGM is decreased from the second step pulse voltage VSTEP-VDOWN1 to the third step pulse voltage VSTEP-VDOWN2 (i.e., VDOWN2 is greater than VDOWN1). After the memory cells are programmed, program states of the memory cells are verified based on the first verification voltage VVF1, the second verification voltage VVF2, and the third verification voltage VVF3.

As illustrated in FIG. 8E, the first pass-fail result FIRST Y-SCAN is determined to be a pass result PASS, the second pass-fail result SECOND Y-SCAN is determined to be a pass result PASS, and the third pass-fail result THIRD Y-SCAN is still determined to be a fail result FAIL. That is, as threshold voltages of the memory cells are increased, the memory cells are divided into the third set of the memory cells (i.e., second pass memory cells and third fail memory cells) and the fourth set of the memory cells (i.e., third pass memory cells). In an embodiment, the first pass-fail result FIRST Y-SCAN may not be generated after the increment value of the program voltage VPGM is decreased from the second step pulse voltage VSTEP-VDOWN1 to the third step pulse voltage VSTEP-VDOWN2. Thus, the first verification voltage VVF1 is illustrated as a dotted line in FIG. 8E. In a next program loop, a program prohibit voltage may be applied to bit-lines coupled to the third pass memory cells in order not to program the third pass memory cells. A ground voltage may be applied to bit-lines coupled to the third fail memory cells in order to program the third fail memory cells.

Figure 8F:
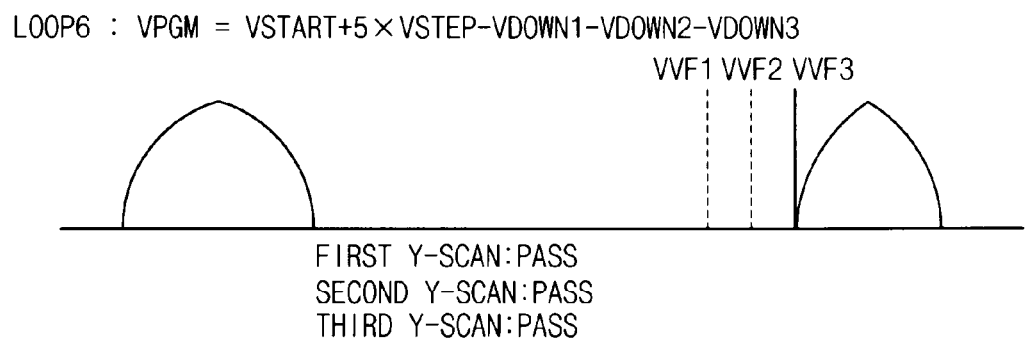

Referring to FIG. 8F, a sixth program loop LOOP6 is performed after the fifth program loop LOOP5 ends. In the sixth program loop LOOP6, a sixth program voltage VSTART+5*VSTEP-VDOWN1-VDOWN2-VDOWN3 is applied as the program voltage VPGM to word-lines coupled to memory cells (i.e., the third fail memory cells). The increment value of the program voltage VPGM corresponds to a fourth step pulse voltage VSTEP-VDOWN3. That is, the increment value of the program voltage VPGM is decreased from the third step pulse voltage VSTEP-VDOWN2 to the fourth step pulse voltage VSTEP-VDOWN3 (i.e., VDOWN3 is greater than VDOWN2). After the memory cells are programmed, program states of the memory cells are verified based on the first verification voltage VVF1, the second verification voltage VVF2, and the third verification voltage VVF3.

As illustrated in FIG. 8F, the first pass-fail result FIRST Y-SCAN is determined to be a pass result PASS, the second pass-fail result SECOND Y-SCAN is determined to be a pass result PASS, and the third pass-fail result THIRD Y-SCAN is determined to be a pass result PASS. That is, as threshold voltages of the memory cells are increased, all memory cells are determined to be third pass memory cells. In an embodiment, the first pass-fail result FIRST Y-SCAN and the second pass-fail result SECOND Y-SCAN may not be generated after the increment value of the program voltage VPGM is decreased from the third step pulse voltage VSTEP-VDOWN2 to the fourth step pulse voltage VSTEP-VDOWN3. Thus, the first verification voltage VVF1 and the second verification voltage VVF2 are illustrated as dotted lines in FIG. 8F. Since all threshold voltages of the memory cells are greater than the third verification voltage VVF3 (e.g., the target threshold voltage), the ISPP operation ends.

FIG. 9 is a diagram illustrating an example in which a program voltage is applied to memory cells by a method of FIG. 6, according to an illustrative embodiment. For convenience of explanation, it is assumed that (n) is equal to three, such that the memory cells are programmed using first through third verification voltages, for example, although it is understood that (n) may be equal to other positive integers without departing from the scope of the present teachings.

Referring to FIG. 9, the ISPP operation is performed for the memory cells based on a program voltage VP, a first verification voltage V1, a second verification voltage V2, and a third verification voltage V3. Here, an increment value of the program voltage VP is changed from a first increment value ΔVPGM1 to a second increment value ΔVPGM2 based on the first pass-fail result. Then, the increment value of the program voltage VP is changed from the second increment value ΔVPGM2 to a third increment value ΔVPGM3 based on the second pass-fail result. The first pass-fail result is generated by comparing threshold voltages of the memory cells with the first verification voltage V1. The second pass-fail result is generated by comparing threshold voltages of the memory cells with the second verification voltage V2. In addition, the ISPP operation ends based on the third pass-fail result. The third pass-fail result is generated by comparing threshold voltages of the memory cells with the third verification voltage V3.

In FIG. 9, the X-axis indicates elapsed time according to the ISPP operation, and the Y-axis indicates the voltages (i.e., the program voltage VP, the first verification voltage V1, the second verification voltage V2, and the third verification voltage V3) applied to word-lines coupled to the memory cells. For example, the memory cells may be programmed (i.e., a program operation) by applying the program voltage VP to word-lines coupled to the memory cells in a first program loop L(1). Then, threshold voltages of the memory cells are compared with the first verification voltage V1 (i.e., a first verification operation). Subsequently, threshold voltages of the memory cells are compared with the second verification voltage V2 (i.e., a second verification operation). Then, threshold voltages of the memory cells are compared with the third verification voltage V3 (i.e., a third verification operation). As described above, after the first program loop L(1) ends, a second program loop L(2) is performed by increasing the program voltage VP by the first increment value ΔVPGM1. Similar to the first program loop L(1), the second and third program loops L(2) and L(3) include the program operation, the first verification operation, the second verification operation, and the third verification operation. In this manner, fourth through (m)th program loops L(4) through L(m) may be sequentially performed.

As illustrated in FIG. 9, the program voltage VP is increased by the first increment value ΔVPGM1 every program loop through the second program loop L(2). The program voltage VP is increased by the second increment value ΔVPGM2 every program loop from the third program loop L(3) to the (m−1)th program loop L(m−1). In addition, the program voltage VP is increased by the third increment value ΔVPGM3 every program loop from the (m)th program loop L(m) until the ISPP operation is finished.

After the memory cells are programmed by applying the program voltage VP to word-lines of the memory cells (i.e., the program operation), program states of the memory cells are verified based on the first verification voltage V1, the second verification voltage V2, and the third verification voltage V3 (i.e., the first verification operation, the second verification operation, and the third verification operation). Here, the first verification voltage V1 is smaller than the second verification voltage V2, the second verification voltage V2 is smaller than the third verification voltage V3, and the third verification voltage V3 may correspond to a target threshold voltage. As the first verification operation, the second verification operation, and the third verification operation are sequentially performed, the first pass-fail result, the second pass-fail result, and the third pass-fail result are sequentially generated. In a next program loop, the program operation is performed for memory cells (e.g., the third fail memory cells) having threshold voltages are smaller than the third verification voltage V3. On the other hand, the program operation is not performed for memory cells (e.g., the third pass memory cell) having threshold voltages greater than the third verification voltage V3. In one example embodiment, the first pass-fail result may not be generated in early phases of the ISPP operation (e.g., in early program loops). Thus, the first verification voltage V1 is illustrated as a dotted line in the first program loop L(1).

In the second program loop L(2), the increment value of the program voltage VP is changed (e.g., decreased) from the first increment value ΔVPGM1 to the second increment value ΔVPGM2 when all threshold voltages of the memory cells are greater than the first verification voltage V1. Thus, the program voltage VP is increased by the second increment value ΔVPGM2 every program loop from the third program loop L(3). Similarly, in the (m−1)th program loop L(m−1), the increment value of the program voltage VP is changed (e.g., decreased) from the second increment value ΔVPGM2 to the third increment value ΔVPGM3 when all threshold voltages of the memory cells are greater than the second verification voltage V2. Thus, the program voltage VP is increased by the third increment value ΔVPGM3 every program loop from the (m)th program loop L(m).

In an embodiment, the first pass-fail result may not be generated after the increment value of the program voltage VP is changed (e.g. decreased) from the first increment value ΔVPGM1 to the second increment value ΔVPGM2. Thus, the first verification voltage V1 is illustrated as a dotted line in the third program loop L(3). Similarly, the first pass-fail result and the second pass-fail result may not be generated after the increment value of the program voltage VP is changed (e.g. decreased) from the second increment value ΔVPGM2 to the third increment value ΔVPGM3. Thus, the first verification voltage V1 and the second verification voltage V2 are illustrated as dotted lines in the (m)th program loop L(m). In a next program loop, the program operation is performed for memory cells (e.g., the third fail memory cells) having threshold voltages smaller than the third verification voltage V3. On the other hand, the program operation may not be performed for memory cells (e.g., the third pass memory cells) having threshold voltages greater than the third verification voltage V3. Finally, the ISPP operation is finished when all threshold voltages of the memory cells are greater than the third verification voltage V3.

Generally, when memory cells of a non-volatile memory device are programmed using an ISPP method, a threshold voltage distribution may be dense when the increment value of the program voltage VP is relatively small, and the number of program loops for the ISPP operation is increased when the increment value of the program voltage VP is relatively small. On the other hand, when memory cells of a non-volatile memory device are programmed using the ISPP method, the number of program loops for the ISPP operation is decreased when the increment value of the program voltage VP is relatively great, and a threshold voltage distribution may be broad when the increment value of the program voltage VP is relatively great. To address these issues, the method of FIG. 6 adaptively changes (e.g. decrease) the increment value of the program voltage VP based on the first pass-fail result, the second pass-fail result, and the third pass-fail result according to the ISPP operation. As described above, the first pass-fail result is generated by comparing threshold voltages of the memory cells with the first verification voltage V1 that is smaller than the second verification voltage V2. In addition, the second pass-fail result is generated by comparing threshold voltages of the memory cells with the second verification voltage V2 that is smaller than the third verification voltage V3. Further, the third pass-fail result is generated by comparing threshold voltages of the memory cells with the third verification voltage V3 that corresponds to the target threshold voltage. Thus, the method of FIG. 6 may prevent unnecessary power consumption due to excessive increases of the program voltage VP, and may have a dense threshold voltage distribution while decreasing the number of program loops.

Figure 10:
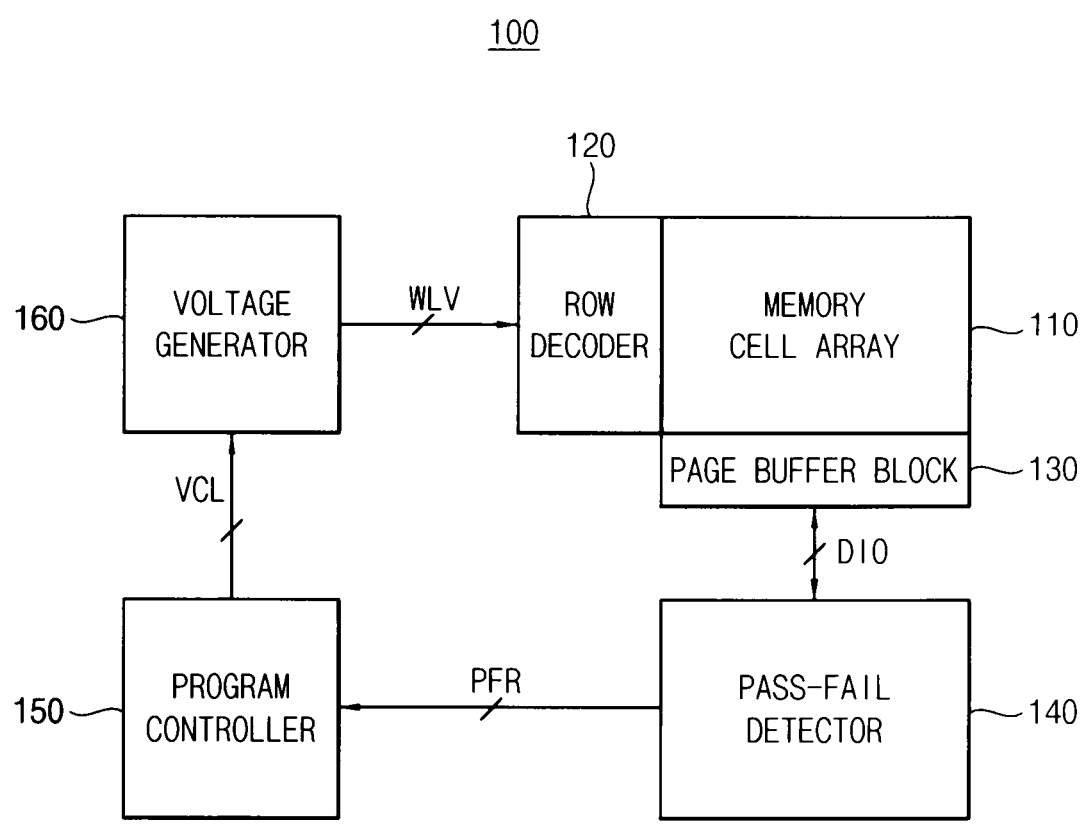
FIG. 10 is a block diagram illustrating a non-volatile memory device employing a method of programming memory cells, according to illustrative embodiments.

FIG. 10 is a block diagram illustrating a non-volatile memory device employing a method of programming memory cells, according to illustrative embodiments.

Referring to FIG. 10, the non-volatile memory device 100 includes a memory cell array 110, a row decoder 120, a page buffer block 130, a pass-fail detector 140, a program controller 150, and a voltage generator 160.

The memory cell array 100 includes multiple memory cells. The memory cells may have a structure having a charge storage layer, such as a charge trap flash structure, a stack flash structure, a non-source/drain flash structure, a pin-type flash structure, or the like. The non-volatile memory device 100 may be a NAND flash memory device, although the non-volatile memory device 100 is not limited thereto. The memory cells in the memory cell array 110 may be programmed based on word-line voltages WLV and bit-line voltages. The word-line voltages WLV are input via the row decoder 120 and the bit-line voltages are input via the page buffer block 130. Here, the memory cells in the memory cell array 110 may be programmed in a page unit. That is, memory cells coupled to one selected word-line may be programmed at the same time. The memory cells in the memory cell array 110 may be SLCs that store one bit data or MLCs that store multi-bit data.

The row decoder 120 provides the word-line voltages WLV to the memory cell array 110. The word-line voltages WLV are generated by the voltage generator 160. The row decoder 120 receives a row address signal from an address buffer, and provides the word-line voltages WLV to corresponding word-lines. The row decoder 120 provides a program voltage and a pass voltage as the word-line voltages WLV when the ISPP operation is performed. Here, the program voltage may be applied to selected word-lines, and the pass voltage may be applied to non-selected word-lines.

The page buffer block 130 may include multiple page buffers coupled to bit-lines of the memory cell array 110, respectively. The page buffer block 130 may operate as a write driver, or a sense amplifier based on operation modes of the non-volatile memory device 100 by transferring data input/output signals DIO. For example, the page buffer block 130 operates as the sense amplifier in a read operation mode, and operates as the write driver in a program operation mode. In addition, when the ISPP operation is performed, the page buffer block 130 may provide verification voltages for determining program states of the memory cells, and may read or detect threshold voltages of the memory cells.

The pass-fail detector 140 verifies program states of the memory cells by using a column scan pass/fail check method, or a wired-OR pass/fail check method, for example. The pass-fail detector 140 may verify program states of the memory cells every program loop based on multiple verification voltages when the ISPP operation is performed, as discussed above. For example, the verification voltages may include a first verification voltage and a second verification voltage. Here, the first verification voltage is smaller than the second verification voltage, and the second verification voltage may correspond to a target threshold voltage. In this case, the pass-fail detector 140 performs a first read operation and a first status check operation. In the first read operation, the pass-fail detector 140 reads threshold voltages of the memory cells. In the first status check operation, the pass-fail detector 140 compares threshold voltages of the memory cells with the first verification voltage. Subsequently, the pass-fail detector 140 performs a second read operation and a second status check operation. In the second read operation, the pass-fail detector 140 reads threshold voltages of the memory cells. In the second status check operation, the pass-fail detector 140 compares threshold voltages of the memory cells with the second verification voltage.

The program controller 150 controls the ISPP operation based on the pass-fail result PFR generated by the pass-fail detector 140. In an embodiment, when the ISPP operation is performed, a first pass-fail result is generated by comparing threshold voltages of the memory cells with the first verification voltage, and a second pass-fail result is generated by comparing threshold voltages of the memory cells with the second verification voltage. In this case, the program controller 150 decreases an increment value of the program voltage based on the first pass-fail result, and finishes the ISPP operation based on the second pass-fail result. In another embodiment, when the ISPP operation is performed, first through (n)th pass-fail results are generated based on first through (n)th verification voltages. In this case, the program controller 150 sequentially decreases an increment value of the program voltage based on the first through (n−1)th pass-fail results, and finishes the ISPP operation based on the (n)th pass-fail result.

The voltage generator 160 generates the word-line voltages WLV based on operation modes of the non-volatile memory device 100, and provides the word-line voltages WLV to the memory cell array 110 via the row decoder 120. For example, the read voltage and the read verification voltage may be generated in the read operation mode, the program voltage and the pass voltage may be generated in the program operation mode, and the erase voltage may be generated in the erase operation mode. In particular, when the ISPP operation is performed, the voltage generator 160 adaptively decreases the increment value of the program voltage, so that unnecessary power consumption due to excessive increases of the program voltage may be prevented.

Figure 11:
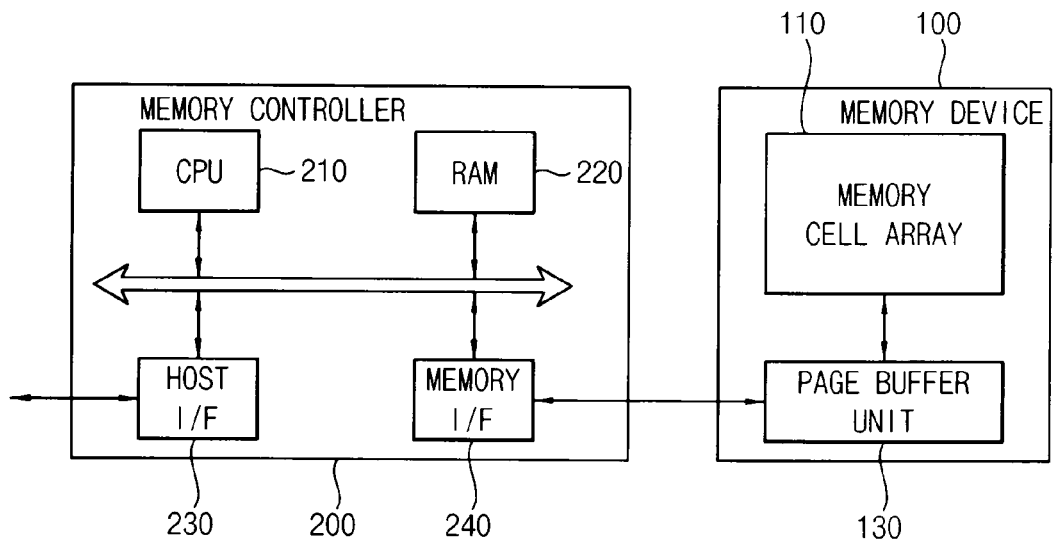
FIG. 11 is a block diagram illustrating a memory system having a non-volatile memory device of FIG. 10, according to illustrative embodiments.

FIG. 11 is a block diagram illustrating a memory system having a non-volatile memory device of FIG. 10, according to illustrative embodiments.

Referring to FIG. 11, the memory system 300 includes a non-volatile memory device 100 and a memory controller 200.

The non-volatile memory device 100 includes the memory cell array 110, the row decoder 120, the page buffer block 130, the pass-fail detector 140, the program controller 150, and the voltage generator 160, as discussed above. In an embodiment, the non-volatile memory device 100 may be a flash memory device (e.g., a NAND flash memory device). As described above, the non-volatile memory device 100 may adaptively decrease the increment value of the program voltage when the ISPP operation is performed.

The memory controller 200 includes a central processing unit (CPU) 210, random access memory (RAM) 220, a host interface 230, and a memory interface 240. The memory controller 200 controls the non-volatile memory device 100, and may transfer data between external host devices and the non-volatile memory device 100. The CPU 210 may control the RAM 220, the host interface 230, and the memory interface 240 for processing the data. The RAM 220 may temporarily store data provided from the external host devices, or data provided from the non-volatile memory device 100. For example, the RAM 220 may be implemented by a dynamic random access memory (DRAM) device, a static random access memory (SRAM) device, a phase random access memory (PRAM) device, a ferroelectric random access memory (FRAM) device, a resistive random access memory (RRAM) device, and/or a magnetic random access memory (MRAM) device. The host interface 230 enables communication with the external host devices, and the memory interface 240 enables communication with the non-volatile memory device 100. In addition, the CPU 210 may control the memory interface 240 and the non-volatile memory device 100.

According to various embodiments, the host interface 230 may interact with the external host devices using a standard protocol, such as universal serial bus (USB), multimedia card (MMC), peripheral component interconnection (PCI), peripheral component interconnection express (PCI-EXPRESS), advanced technology attachment (ATA), serial advanced technology attachment (SATA), parallel advanced technology attachment (PATA), small computer system interface (SCSI), enhanced small disk interface (ESDI), serial attached small computer system interface (SAS), integrated drive electronics (IDE), or the like. In addition, the memory interface 240 may interact with the non-volatile memory device 100 using a standard protocol, such as NAND interface protocol. The memory controller 200 may be included in the non-volatile memory device 100, for example. The non-volatile memory device 100 having the built-in memory controller 200 may be referred to as One-NAND memory device.

Figure 12:
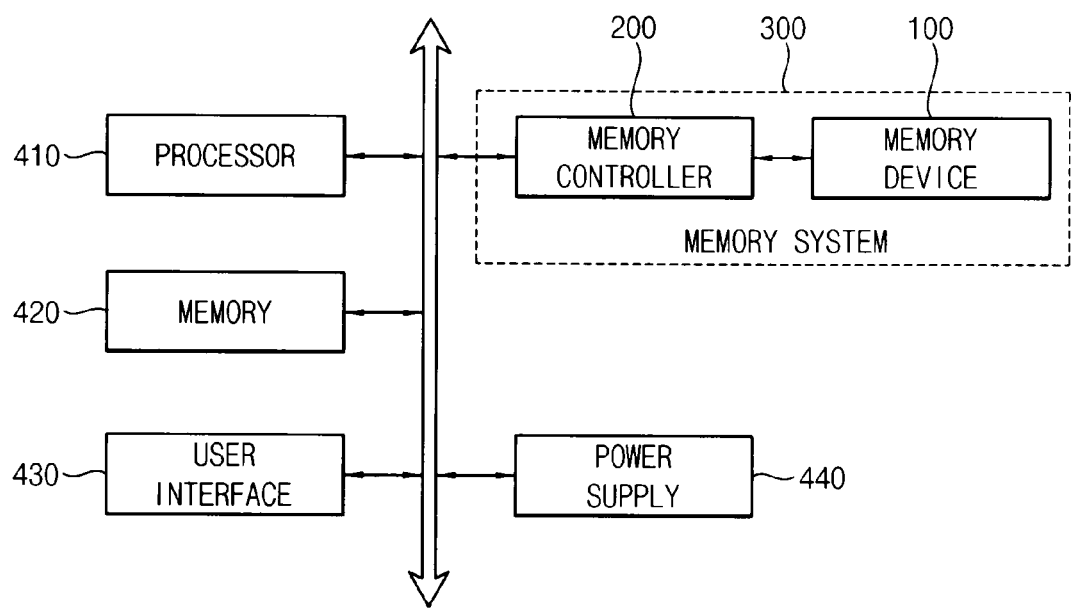
FIG. 12 is a block diagram illustrating a computing system having a memory system of FIG. 11, according to illustrative embodiments.

FIG. 12 is a block diagram illustrating a computing system having a memory system of FIG. 11, according to illustrative embodiments.

Referring to FIG. 12, the computing system 500 includes the memory system 300, a processor 410, a memory device 420, a user interface 430, and a power supply 440.

The memory system 300 may include the non-volatile memory device 100 and the memory controller 200, as discussed above. The processor 410 performs calculations, or computing functions for various tasks. For example, the processor 410 may be a microprocessor. The processor 410 may be coupled to the memory device 420 via an address bus, a control bus, and/or a data bus. For example, the memory device 420 may be implemented by a DRAM device, a SRAM device, a PRAM device, a FRAM device, a RRAM device, and/or a MRAM device. The processor 410 may be coupled to an extended bus, such as a peripheral component interconnection (PCI) bus. The processor 410 may control the user interface having at least one input device (e.g., a keyboard, a mouse, etc) and at least one output device (e.g., a printer, a display device, etc). The power supply 440 supplies operation voltages for the computing system 500. According to various embodiments, the computing system 500 may further include an application chipset, a camera image processor (CIS), or the like. The non-volatile memory device 100 may be a flash memory device (e.g., a NAND flash memory device), although the non-volatile memory device 100 is not limited thereto.

The present inventive concept may be applied to a system having a non-volatile memory device (e.g., a flash memory device). Thus, the present inventive concept may be applied to a system such as a desktop computer, a laptop computer, a digital camera, a video camcorder, a cellular phone, a smart phone, a portable multimedia player (PMP), a personal digital assistant (PDA), an MP3 player, a digital television, a solid state drive (SSD), a navigation device, or the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of programming a plurality of memory cells for a non-volatile memory device, the method comprising:

performing a program operation using an incremental step pulse program (ISPP) operation, a first verification operation using a first verification voltage, and a second verification operation using a second verification voltage;

changing an increment value of the ISPP operation based on a first result of the first verification operation; and finishing the program operation based on a second result of the second verification operation, wherein the first verification voltage is smaller than the second verification voltage.

2. The method of claim 1, wherein the second verification voltage corresponds to a target threshold voltage.

3. The method of claim 1, wherein performing the ISPP operation comprises:

increasing threshold voltages of the memory cells by applying a program voltage to the memory cells;

generating the first result by comparing the threshold voltages of the memory cells with the first verification voltage; and generating the second result by comparing the threshold voltages of the memory cells with the second verification voltage.

4. The method of claim 3, wherein generating the first result begins after a predetermined number of program loops are performed.

5. The method of claim 3, wherein generating the first result ends after the increment value is changed.

6. The method of claim 3, wherein generating the first result comprises:

determining the memory cells to be first fail memory cells when the threshold voltages of the memory cells are smaller than the first verification voltage; and determining the memory cells to be first pass memory cells when the threshold voltages of the memory cells are greater than the first verification voltage.

7. The method of claim 6, wherein changing the increment value comprises:

maintaining the increment value when at least one of the memory cells is determined to be a first fail memory cell; and decreasing the increment value when all the memory cells are determined to be first pass memory cells.

8. The method of claim 3, wherein generating the second result comprises:

determining the memory cells to be second fail memory cells when the threshold voltages of the memory cells are smaller than the second verification voltage; and determining the memory cells to be second pass memory cells when the threshold voltages of the memory cells are greater than the second verification voltage.

9. The method of claim 8, wherein finishing the program operation comprises:

maintaining the program operation when at least one of the memory cells is determined to be a second fail memory cell; and finishing the program operation when all the memory cells are determined to be second pass memory cells.

10. The method of claim 1, wherein the non-volatile memory device is one of a NAND flash memory device or a NOR flash memory device.

11. The method of claim 10, wherein the memory cells are single level memory cells (SLCs) or multi level memory cells (MLCs).

12. A method of programming a plurality of memory cells for a non-volatile memory device, the method comprising:

performing a program operation using an incremental step pulse program (ISPP) operation, and first through (n)th verification operations using first through (n)th verification voltages, respectively, where n is a positive integer greater than 1;

changing an increment value of the ISPP operation based on first through (n−1)th results of the first through (n−1)th verification operations, respectively;

finishing the program operation based on a (n)th result of the (n)th verification operation, wherein the increment value includes first through (n−1)th increment values, the first through (n−1)th increment values being smaller as n increases;

wherein the first through (n)th verification voltage are greater as n increases;

wherein the (n)th verification voltage corresponds to a target threshold voltage;

wherein performing the program operation comprises:

increasing threshold voltages of the memory cells by applying a program voltage to the memory cells; and generating the first through (n)th results by comparing the threshold voltages of the memory cells with the first through (n)th verification voltages, respectively.

13. The method of claim 12, wherein generating the first through (n)th results comprises:

determining the memory cells to be first through (n)th fail memory cells when the threshold voltages of the memory cells are smaller than the first through (n)th verification voltages, respectively; and determining the memory cells to be first through (n)th pass memory cells when the threshold voltages of the memory cells are greater than the first through (n)th verification voltages, respectively.

14. The method of claim 13, wherein changing the increment value comprises:

sequentially selecting the first through (n−1)th increment values as the increment value based on the first through (n−1)th results of the memory cells.

15. The method of claim 14, wherein finishing the program operation comprises:

maintaining the program operation when at least one of the memory cells is determined to be a (n)th fail memory cell; and finishing the program operation when all the memory cells are determined to be (n)th pass memory cells.

16. A memory system comprising:

a non-volatile memory device; and a memory controller configured to control the non-volatile memory device, wherein the non-volatile memory device programs a plurality of memory cells by performing a program operation using an incremental step pulse program (ISPP) operation, a first verification operation using a first verification voltage, and a second verification operation using a second verification voltage, by changing an increment value of the ISPP operation based on a first result of the first verification operation, and by finishing the program operation based on a second result of the second verification operation, wherein the non-volatile memory device increases threshold voltages of the memory cells by applying a program voltage to the memory cells, and generates the first and second results by comparing the threshold voltages of the memory cells with the first and second verification voltages, respectively when the program operation is performed, wherein the increment value includes first and second increment values, the first increment value is greater than the second increment value, and the first verification voltage is smaller than the second verification voltage.

17. The system of claim 16, wherein the second verification voltage corresponds to a target threshold voltage.

18. The system of claim 16, wherein the non-volatile memory device includes:
- a memory cell array having the memory cells;
- a row decoder configured to provide a plurality of word-line voltages to the memory cell array;
- a page buffer block configured to operate as a write driver or a sense amplifier based on operation modes of the non-volatile memory device;
- a pass-fail detector configured to verify program states of the memory cells every program loop based on the first and second verification voltages when the ISPP operation is performed;
- a program controller configured to control the ISPP operation based on the first and second results generated by performing the first and second verification operations, respectively; and
- a voltage generator configured to generate the word-line voltages.

* * * * *